United States Patent [19]
Yoneda et al.

[11] Patent Number: 5,495,395
[45] Date of Patent: Feb. 27, 1996

[54] FACE-MOUNTING TYPE MODULE SUBSTRATE ATTACHED TO BASE SUBSTRATE FACE TO FACE

[75] Inventors: Takehiko Yoneda; Masahiro Yoshimoto; Yoshihiko Takayama; Tetsjhi Tsujhi; Hiromitsu Taki, all of Miyazaki, Japan

[73] Assignee: Matsushita Electric Industrial Co., Ltd., Osaka, Japan

[21] Appl. No.: 949,977

[22] Filed: Sep. 24, 1992

[51] Int. Cl.⁶ .......................... H05K 7/12; H01R 23/72; H01R 9/09
[52] U.S. Cl. .............. 361/769; 174/138 G; 174/265; 361/767; 361/768; 361/770; 361/785; 361/787; 361/789; 361/790; 439/79; 439/80; 439/81; 439/82; 439/84; 439/86; 439/66; 439/91
[58] Field of Search ..................... 174/265, 138 G, 174/151, 152 R, 153 G; 228/180.21, 180.22; 361/760, 762, 769, 770, 771, 773, 776, 784, 785, 787, 789, 790, 807, 808, 809, 735, 736, 742, 743, 744, 767, 774; 439/79, 80, 75, 81, 82, 84, 85, 87, 90, 91, 591, 586

[56] References Cited

U.S. PATENT DOCUMENTS

| | | | |
|---|---|---|---|
| Re. 34,084 | 9/1992 | Noschese | 439/66 |
| 3,880,486 | 4/1975 | Avakian | 439/70 |
| 4,003,621 | 1/1977 | Lamp | 439/586 |
| 4,333,102 | 6/1982 | Jester et al. | 257/777 |
| 4,449,774 | 5/1984 | Takashi et al. | 439/59 |
| 4,664,309 | 5/1987 | Allen et al. | 228/180.21 |
| 4,705,205 | 11/1987 | Allen et al. | 228/180.21 |
| 4,712,721 | 12/1987 | Noel et al. | . |
| 4,791,248 | 12/1988 | Oldenettel | 174/265 |
| 4,793,814 | 12/1988 | Zifcak et al. | 439/66 |
| 5,049,084 | 9/1991 | Bakke | 439/66 |
| 5,049,085 | 9/1991 | Reylek et al. | 439/91 |
| 5,067,007 | 11/1991 | Kanji et al. | 257/698 |
| 5,071,359 | 12/1991 | Arnio et al. | 439/91 |
| 5,073,124 | 12/1991 | Powell | 361/785 |
| 5,096,426 | 3/1992 | Simpson et al. | 439/66 |
| 5,163,834 | 11/1992 | Chapin et al. | 439/66 |
| 5,257,452 | 11/1993 | Imai et al. | 174/265 |
| 5,372,848 | 12/1994 | Blackwell et al. | 427/250 |

FOREIGN PATENT DOCUMENTS 2-237129  9/1990  Japan ..................... 257/778

*Primary Examiner*—Donald A. Sparks
*Attorney, Agent, or Firm*—Pollock, Vande Sande & Priddy

[57] ABSTRACT

A module substrate consists of a substrate mounting electronic parts on one surface thereof, a conductor for electrically conducting the electronic parts mounted on the substrate to the other surface of the substrate, a conductive solder for attaching the conductor to a base substrate movably contacting the other surface of the substrate to electrically connect the electronic parts with the base substrate, and a deformable bushing for holding the conductor to maintain the attachment of the conductor to the base substrate regardless of whether the base substrate is moved.

10 Claims, 17 Drawing Sheets

SOLDER LAYER

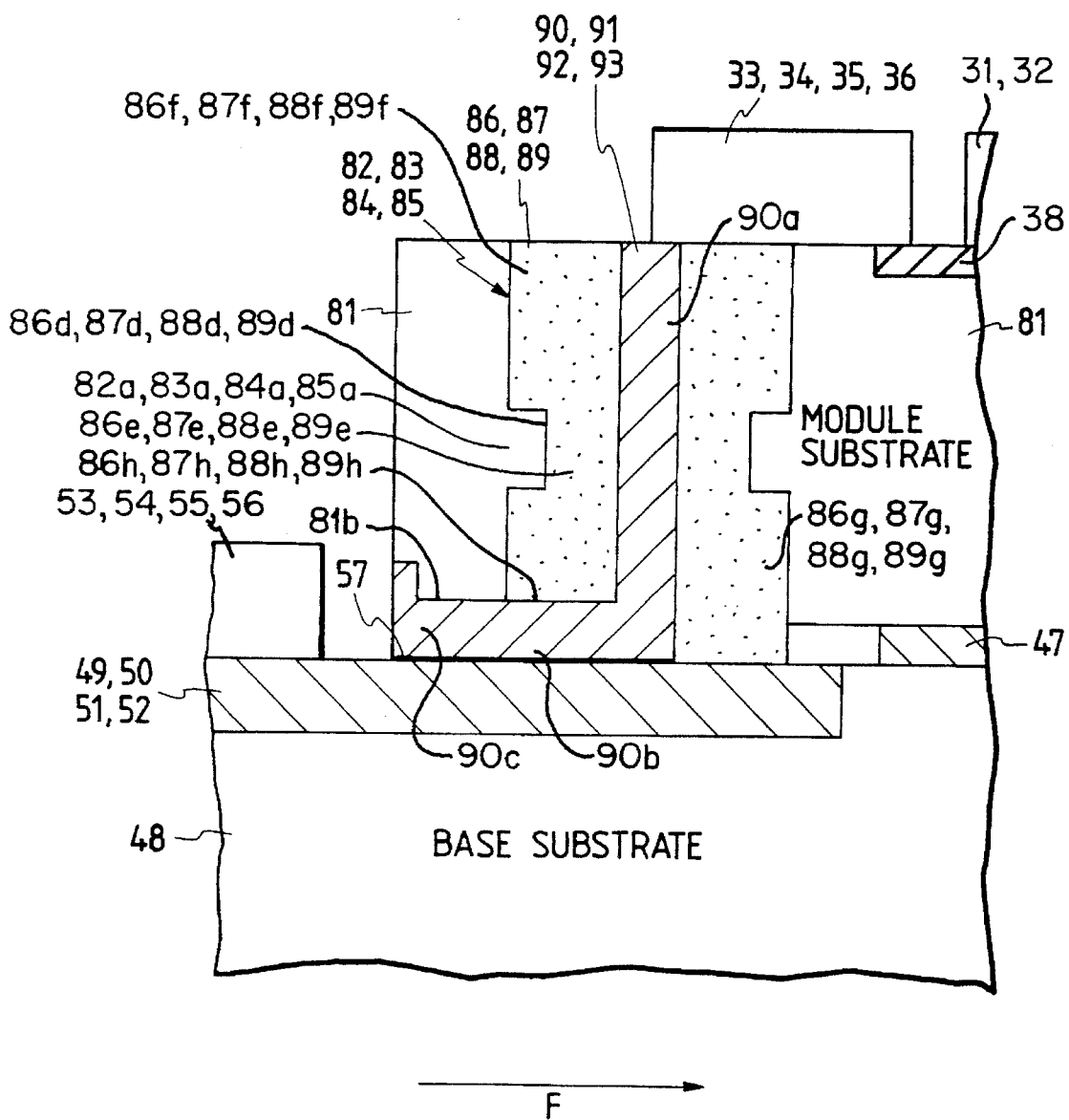

FIG. 20

| SAMPLE No. | MATERIALS OF COMPOSING ELEMENTS | | | POSSIBILITY OF DETACHMENT (%) | | | |
|---|---|---|---|---|---|---|---|
| | BASE SUBSTRATE | MODULE SUBSTRATE | BUSH | NUMBER OF REFLOW PROCEDURE | | | |
| | | | | 1 | 2 | 3 | 4 |
| 1 | GLASS EPOXY RESIN | $Al_2O_3$ | FLUOROCARBON RESIN | 0 | 0 | 0 | 10 |
| 2 | GLASS EPOXY RESIN | $Ba_2Ti_9O_{20}$ | FLUOROCARBON RESIN | 0 | 0 | 0 | 10 |
| 3 | GLASS EPOXY RESIN | ALUMINIUM ENAMEL | POLYIMIDE RESIN | 0 | 0 | 0 | 0 |
| 4 | GLASS EPOXY RESIN | QUARTZ POLYIMIDE | LIQUID CRYSTAL POLYMER | 0 | 0 | 0 | 10 |
| 5 | GLASS EPOXY RESIN | $Al_2O_3$ | | 30 | 80 | 100 | 100 |
| 6 | GLASS EPOXY RESIN | $Ba_2Ti_9O_{20}$ | | 40 | 80 | 100 | 100 |
| 7 | GLASS EPOXY RESIN | ALUMINIUM ENAMEL | | 0 | 20 | 50 | 90 |
| 8 | GLASS EPOXY RESIN | QUARTZ POLYIMIDE | | 30 | 90 | 100 | 100 |

FACE-MOUNTING TYPE MODULE SUBSTRATE ATTACHED TO BASE SUBSTRATE FACE TO FACE

BACKGROUND OF THE INVENTION

1. Field of the Invention

The present invention relates to a module substrate attached to a base substrate which is utilized for a radio communication device, a measuring device, and the like, and, in particular, relates to a module substrate attached to a base substrate which is utilized for an automobile telephone or a portable telephone equipped with a small-sized communication device.

2. Description of the Related Art

Generally, an automobile telephone, a portable telephone, a personal radio device and the like are respectively equipped with small-sized communication devices which each are fabricated on a module substrate. Each of the small-sized communication devices consists of a large number of electronic parts mounted on the module substrate, and the electronic parts are electrically connected with electronic circuits put in a base substrate to utilize the electronic parts for a desired communication purpose with perfect freedom.

In this case, the module substrate is attached to the base substrate with conductive solder. Therefore, the electronic parts are electrically connected with the electronic circuits on the base substrate through the conductive solder.

In addition, in cases where the base substrate is made of glass epoxy resin, the module substrate is conventionally made of resin. Also, in cases where the base substrate is made of ceramics, the module substrate is conventionally made of resin or ceramics. However, the miniaturization of the communication device has been recently desired. Therefore, the base substrate is made of the glass epoxy resin, and the module substrate is made of the ceramics to achieve the miniaturization of the communication device.

2.1. PREVIOUSLY PROPOSED ART

FIG. 1 is a side cross sectional view of a conventional module substrate attached to a base substrate, and FIG. 2 is an enlarged side cross sectional view of conducting parts of the conventional module substrate shown in FIG. 1.

As shown in FIG. 1, a conventional module substrate attached to a base substrate comprises a module substrate 11 made of a dielectric ceramic material and a base substrate 12 made of a glass epoxy resin. The module substrate 11 is attached to a surface of the base substrate 12.

The module substrate 11 is equipped with electronic parts 13, 14 such as a condenser mounted on an upper surface of the module substrate 11, printed wires 15, 16 electrically connected with the respective electronic parts 13, 14, through holes 17, 18 penetrating the module substrate 11 from the upper surface to a lower surface adjacent to the base substrate 12, and conducting layers 19, 20 laid on the surfaces of the through holes 17, 18 for electrically connecting the electronic parts 13, 14 to the lower surface of the module substrate 11 through the printed wires 15, 16. The module substrate 11 is generally equipped with dozens of electronic parts for practical purposes.

Moreover, as shown in FIG. 3, the module substrate 11 is equipped with lower electrodes 21, 22 provided on the lower surface of the module substrate 11 surrounding the through holes 17, 18 and electrically connected with the conducting layers 19, 20, an earth terminal 23, and grooves 24, 25 surrounding the lower electrodes 21, 22 for electrically separating the lower electrodes 21, 22 from the earth terminal 23.

The base substrate 12 is equipped with printed wires 26, 27 on the surface adjacent to the lower surface of the module substrate 11. The printed wires 26, 27 are electrically connected with the lower electrodes 21, 22 through solder layers. In addition, the base substrate 12 is equipped with electronic parts 28, 29 electrically connected with the electronic parts 13, 14 through the printed wires 15, 16, the conducting layers 19, 20 and the printed wires 26, 27. A plurality of module substrates are generally mounted on the base substrate 12, and the base substrate 12 is equipped with a large number of electronic parts for practical purposes.

In the above configuration of the module substrate 11 attached to the base substrate 12, a procedure for attaching the module substrate 11 to the base substrate 12 is described.

The electronic parts 13, 14, the printed wires 15, 16, the conducting layers 19, 20, the lower electrodes 21, 22, and the earth terminal 23 are initially fabricated in the module substrate 11 by a prescribed operation, and the printed wires 26, 27 are printed on the surface of the base substrate 12.

Thereafter, the module substrate 11 and the electronic parts 28, 29 are mounted on the base substrate 12 through solder layers. In this case, the solder layers are utilized to bond the lower electrodes 21, 22 to the printed wires 26, 27. Thereafter, the base substrate 12 with the module substrate 11 and the electronic parts 28, 29 passes through a heater such as a reflow device. In this case, the base substrate 12 is heated to about 200° C. in the heater. Therefore, the solder layers are melted before the base substrate 12 is gradually cooled in the atmosphere to solidify the solder layers.

As a result, the module substrate 11 and the electronic part 28 are tightly attached to the base substrate 12, and the electronic parts 13, 14 on the module substrate 11 are electrically connected with the printed wires 26, 27 on the base substrate 12 through the lower electrodes 21, 22 and the solder layers.

Accordingly, the base substrate 12 with the module substrate 11 can be manufactured as shown in FIG. 1.

However, coefficient of thermal expansion of the dielectric ceramic material considerably differs from that of the glass epoxy resin. Therefore, when the base substrate 12 is cooled after the base substrate 12 with the module substrate 11 is taken out from the heater, the base substrate 12 made of the glass epoxy resin considerably contracts, while little contraction occurs in the module substrate 11 made of the dielectric ceramic material.

As a result, tensile stress is generated in the solder layers bonding the lower electrodes 21 to the printed wire 26 and bonding the lower electrode 22 to the printed wire 27. That is, as shown in FIG. 1, the module substrate 11 receives tensile force F from the base substrate 12 in contracting directions. Therefore, the lower electrodes 21, 22 bonded to the printed wires 26, 27 by the solder layers are separated from the printed wires 26, 27. That is, the lower electrodes 21, 22 are electrically disconnected with the printed wires 26, 27. Or, even though the lower electrodes 21, 22 are not separated from the printed wires 26, 27 when the base substrate 12 is cooled, the solder layers keep receiving the tensile stress. Therefore, when the module substrate 11 is given a shock, the lower electrodes 21, 22 are promptly separated from the printed wires 26, 27.

Next, the strength of the tensile stress resulting from the difference in the degree of the thermal expansion of both the substrates 11, 12 is quantitatively described in detail.

The strength σ of the tensile stress is indicated with utilizing the Young's modulus E of the module substrate 11, the coefficient $\alpha_1$ of the thermal expansion of the base substrate 12, the coefficient $\alpha_2$ of the thermal expansion of the module substrate 11, and the variation $\Delta T$ of the temperature as follows.

$$\sigma = E*(\alpha_1 - \alpha_2)*\Delta T \quad (1)$$

For example, the Young's modulus E of $Al_2O_3$ is $350\times10^9$ Newton/m$^2$, and the Young's modulus E of $BaTiO_3$ is $110\times10^9$ Newton/m$^2$. Therefore, the Young's modulus E of the dielectric ceramic material such as $Al_2O_3$ and $BaTiO_3$ generally ranges from $100\times10^9$ Newton/m$^2$ to $350\times10^9$ Newton/m$^2$. The coefficient $\alpha_1$ of the thermal expansion of the glass epoxy resin is about $14\times10^{-6}$ °C$^{-1}$, and the coefficient $\alpha_2$ of the thermal expansion of the dielectric ceramic material is about $9\times10^{-6}$ °C$^{-1}$. The temperature of the base substrate 12 is varied from 200° C. to 20° C.

Therefore, the strength σ of the tensile stress ranges from $90\times10^6$ Newton/m$^2$ to $300\times10^6$ Newton/m$^2$ according to the equation (1).

The bonding strength of the solder layers generally ranges from $200\times10^6$ Newton/m$^2$ to $400\times10^6$ Newton/m$^2$. That is, the strength σ of the tensile stress is sometimes larger than the bonding strength of the solder layers. In other words, in cases where a bond of the solder layer is weaker than the tensile stress, the bond is promptly broken. Also, even though the bond is stronger than the tensile stress and the bonding strength of the solder layers is, for example, $400\times10^6$ Newton/m$^2$, the bond is easily broken when a shock is given to the module substrate 11 because the allowance determined by the difference in the strength between the bond and the tensile strength becomes small.

SUMMARY OF THE INVENTION

An object of the present invention is to provide, with due consideration to the drawbacks of such a conventional module substrate attached to a base substrate, a module substrate, comprising:

a substrate mounting electronic parts on one surface thereof;

conducting means for electrically connecting the electronic parts mounted on the substrate with the other surface of the substrate;

attaching means for attaching the conducting means to a base substrate movably contacting the other surface of the substrate to electrically connect the electronic parts with the base substrate; and holding means for holding the conducting means to maintain the attachment of the conducting means to the base substrate regardless of whether the base substrate is moved.

In the above configuration, the base substrate movably contacts the other surface of the substrate, and the electronic parts mounted on the substrate are electrically connected with the other surface of the substrate by the conducting means. Moreover, the electronic parts are electrically connected with the base substrate by the attaching means such as a conductive solder.

That is, melted conductive solder is applied between the conducting means and the base substrate. Therefore, the substrate and the base substrate are heated up. Thereafter, the melted conductive solder is gradually cooled in the atmosphere. In this case, the substrate and the base substrate respectively contract according to the coefficient of the thermal expansion. Therefore, in cases where the degree of the thermal expansion of the substrate differs from that of the base substrate, tensile stress is generated in the conductive solder bonding the conducting means to the base substrate.

Conventionally, because the substrate is immovably attached to the base substrate, the tensile stress is not released. Therefore, the attachment of the base substrate to the substrate is broken by the tensile stress. In addition, no holding means holds the conducting means. As a result, the electronic parts on the substrate are electrically disconnected with the base substrate.

However, in the present invention, because the conductive means is held by the holding means according to the relative movement of the base substrate resulting from the difference in the contraction of both the substrate and the base substrate, the tensile stress is released even though the base substrate is relatively moved against the substrate. Therefore, the bond of the conductive solder bonding the conducting means to the base substrate is not broken. In other words, the electric connection of the conducting means to the base substrate is maintained.

Accordingly, the electric connection of the electronic parts mounted on the substrate to the base substrate can be reliably maintained.

It is preferable that the holding means be a cylinder-shaped bushing made of plastic material which is packed in a through hole penetrating the substrate from the surface to the other surface.

In the above configuration of the holding means, the bushing is easily inserted in the through hole because the bushing is shaped like a cylinder and is plastically deformed. In addition, when the base substrate is moved, the holding means easily holds the conducting means because the holding means is made of the plastic material.

Accordingly, the module substrate according to the present invention can be easily manufactured without any troublesomeness. In addition, the holding means can hold the conducting means with a high performance.

In addition to the cylinder-shaped bushing made of the plastic material, it is preferable that the conducting means be a conductive film coated on a surface of the cylinder-shaped bush.

In the above configuration, the bushing reliably holds the conductive film according to the movement of the conductive film because the conductive film is coated on the surface of the bushing. Therefore, the electric connection of the electronic parts to the base substrate can be reliably maintained through the conductive film.

Moreover, in addition to the cylinder-shaped bushing, it is preferable that the conducting means be a conductive terminal which is inserted in a hollow portion of the cylinder-shaped bushing.

In the above configuration, the bushing reliably holds the conductive terminal according to the movement of the conductive terminal because the conductive terminal is inserted in the hollow portion of the bushing. Therefore, the attachment of the conductive terminal to the base substrate is not broken.

Accordingly, the electric connection of the electronic parts to the base substrate can be reliably maintained through the conductive terminal.

Further, in addition to the cylinder-shaped bushing, it is preferable that the cylinder-shaped bushing have a ring-shaped concavity around the side thereof and the through hole have a convex portion fitting in the concavity.

In the above configuration, the bushing is firmly held in the through hole because the convex portion of the through hole fits in the concavity of the bushing. Therefore, even though the bushing is roughly sized to the through hole, there is no case that the bushing is taken off from the through hole.

Accordingly, the bushing can be easily manufactured without being precisely sized to the through hole.

It is preferable that the substrate be made of dielectric ceramic material selected from the group consisting of $Al_2O_3$, $Ba_2Ti_9O_{20}$, aluminium enamel, and quartz polyimide.

In the above configuration, little contraction is generated in the dielectric ceramic material when the dielectric ceramic material is cooled. Therefore, the substrate made of the dielectric ceramic material is given tensile strength by the base substrate which generally contracts by a prescribed degree. However, because the conducting means is held by the holding means according to the contraction of the base substrate, the tensile stress is released.

It is preferable that the holding means be made of a bushing of resin selected from the group consisting of fluorocarbon resin, polyimide, and liquid crystal polymer.

In the above configuration, the resin is plastically deformed. In addition, the resin is easily utilized in the module substrate because the bushing type of resin is freely deformed.

Also, the object is achieved by the provision of a module substrate comprising:

a substrate;

a through hole penetrating the substrate from a surface thereof to the other surface;

a bushing made of plastic material which is held in the through hole; and connecting means positioned in the through hole for electrically connecting the surface of the substrate with the other surface.

In the above configuration, the substrate is mounted on a base substrate, and the substrate is attached to the base substrate while cooling the substrate. In addition, the connecting means is attached to the base substrate to accomplish the electric connection to the base substrate. In this case, the base substrate is relatively moved against the substrate because the degree of thermal expansion of the substrate differs from that of the base substrate.

However, the bushing is plastically bent according to the relative movement of the base substrate. Therefore, the electric connection accomplished by the connecting means is maintained even though the base substrate is relatively moved.

Accordingly, the electric connection of the module substrate with the base substrate can be reliably maintained.

BRIEF DESCRIPTION OF THE DRAWINGS

FIG. 19 is an enlarged side cross sectional view of a module substrate attached to a base substrate according to a fourth embodiment of the present invention.

FIG. 20 shows result of experiments indicating the improvement of detachment of the module substrate from the base substrate shown in FIG. 19 in tabular form.

DETAIL DESCRIPTION OF THE PREFERRED EMBODIMENTS

Preferred embodiments of a module substrate attached to a base substrate according to the present invention are described with reference to drawings.

1. First Embodiment

Figure 4:
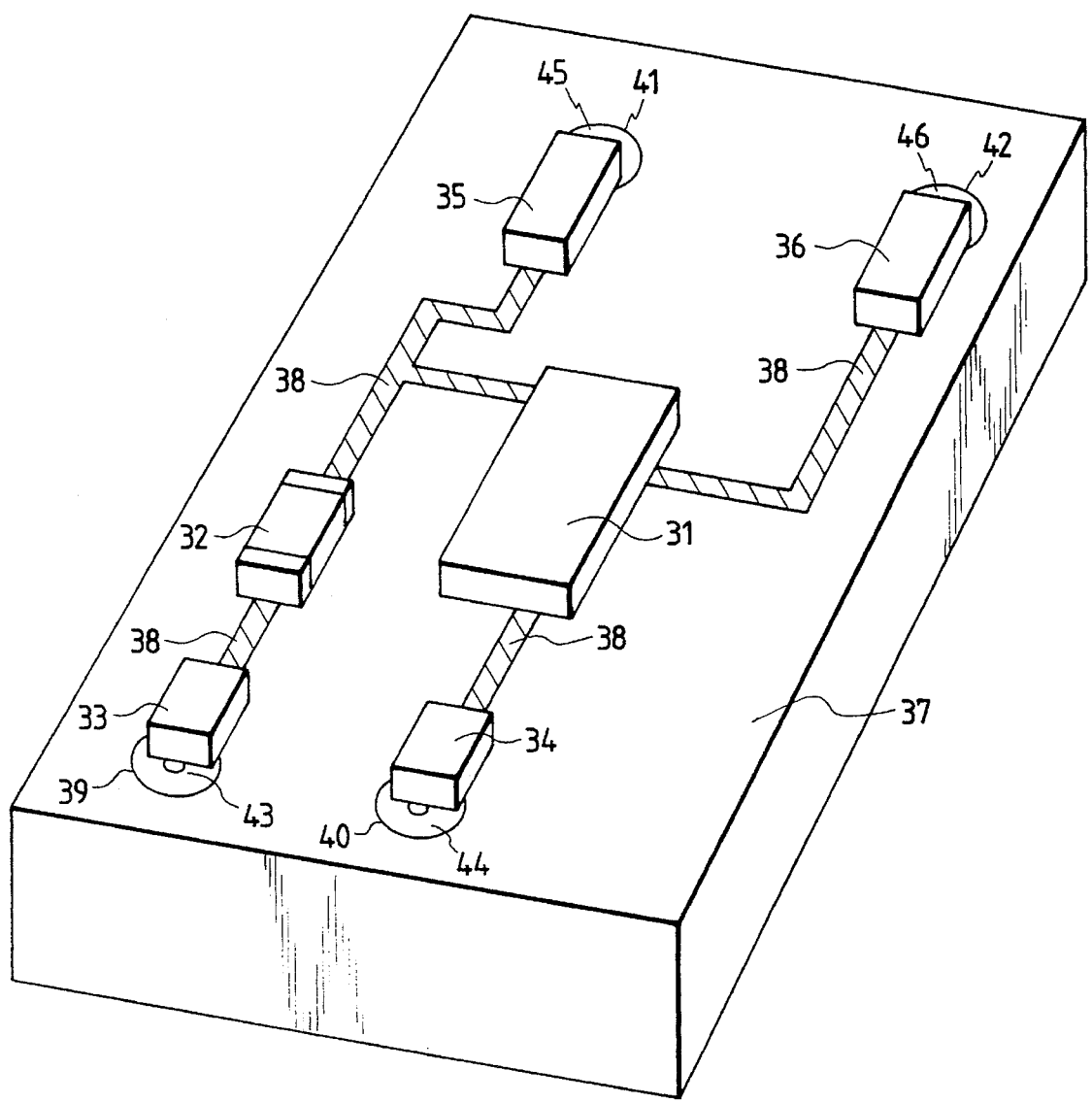
FIG. 4 is a diagonal view showing a surface of a module substrate according to a first embodiment of the present invention.

FIG. 4 is a diagonal view showing a surface of a module substrate according to a first embodiment of the present invention.

Figure 5:
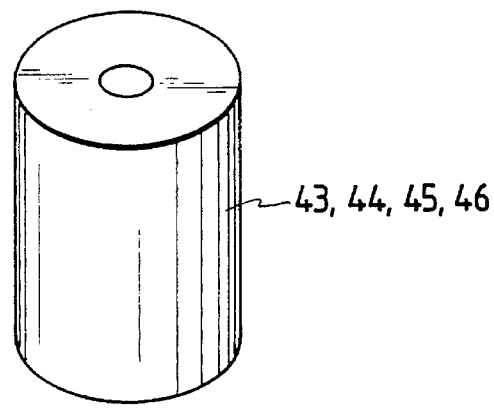
FIG. 5 is a diagonal view of a bushing fitted in a through hole of the module substrate shown in FIG. 4.

As shown in FIG. 4, electronic parts such as an integrated circuit 31, a chip type of condenser 32, jumper wires 33, 34, 35, and 36, and the like are mounted on a surface of a module substrate 37 made of dielectric ceramic material. In addition printed wires 38 are printed on the surface of the module substrate 37 to interconnect the electronic parts 31 to 36. Moreover, column-shaped through holes 39, 40, 41, and 42 are formed in the module substrate 37 just under the jumper wires 34 to 37. The through holes 39 to 42 penetrate the module substrate 37 from its surface to the reverse surface. Further, cylinder-shaped deformable bushings 43, 44, 45, and 46 shown in FIG. 5 are fitted in the through holes 39 to 42 while applying pressure.

Figure 6:
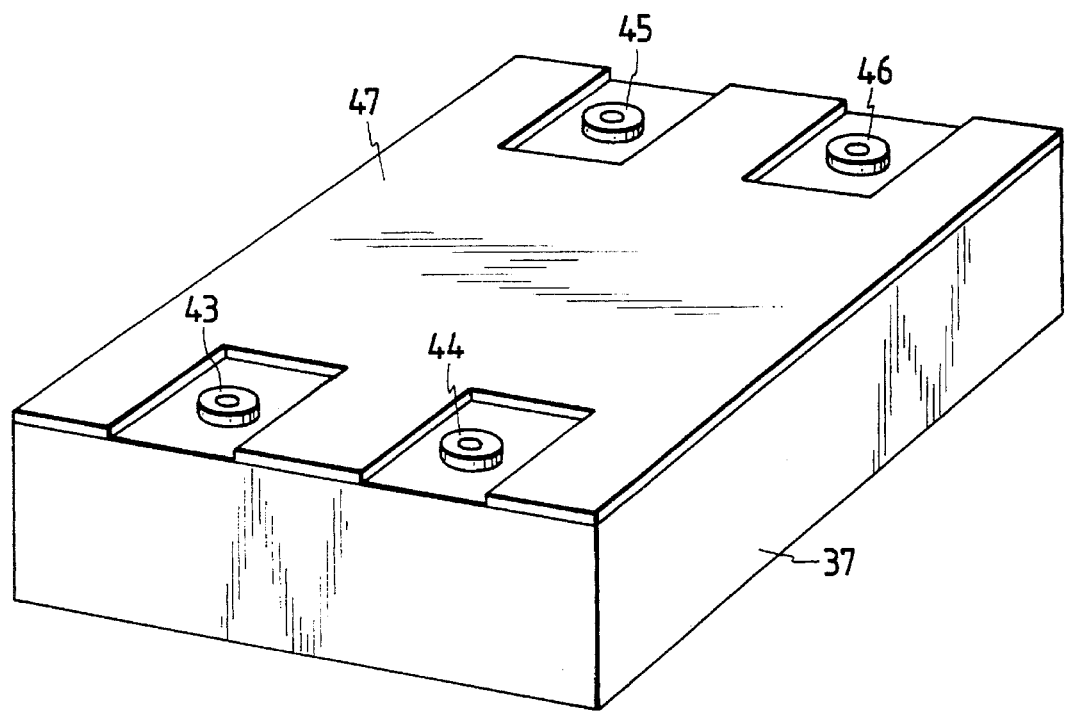
FIG. 6 is a diagonal view showing a reverse surface of the module substrate shown in FIG. 4.

Moreover, as shown in FIG. 6, an earth terminal 47 connected with the earth through a wire (not shown) is attached to the reverse surface of the module substrate 37 other than peripheries of the through holes 39 to 42. The earth terminal 47 has a prescribed thickness, and the deformable bushings 43 to 46 stick out from the through holes 39 to 42 by the thickness of the earth terminal 47. Therefore, the deformable bushings 43 to 46 are deformable in spaces formed by the earth terminal 47 and the reverse surface of the module substrate 37.

Next, the structure of the deformable bushings 43 to 46 pressed in the respective through holes 39 to 42 is described in detail.

Figure 7:
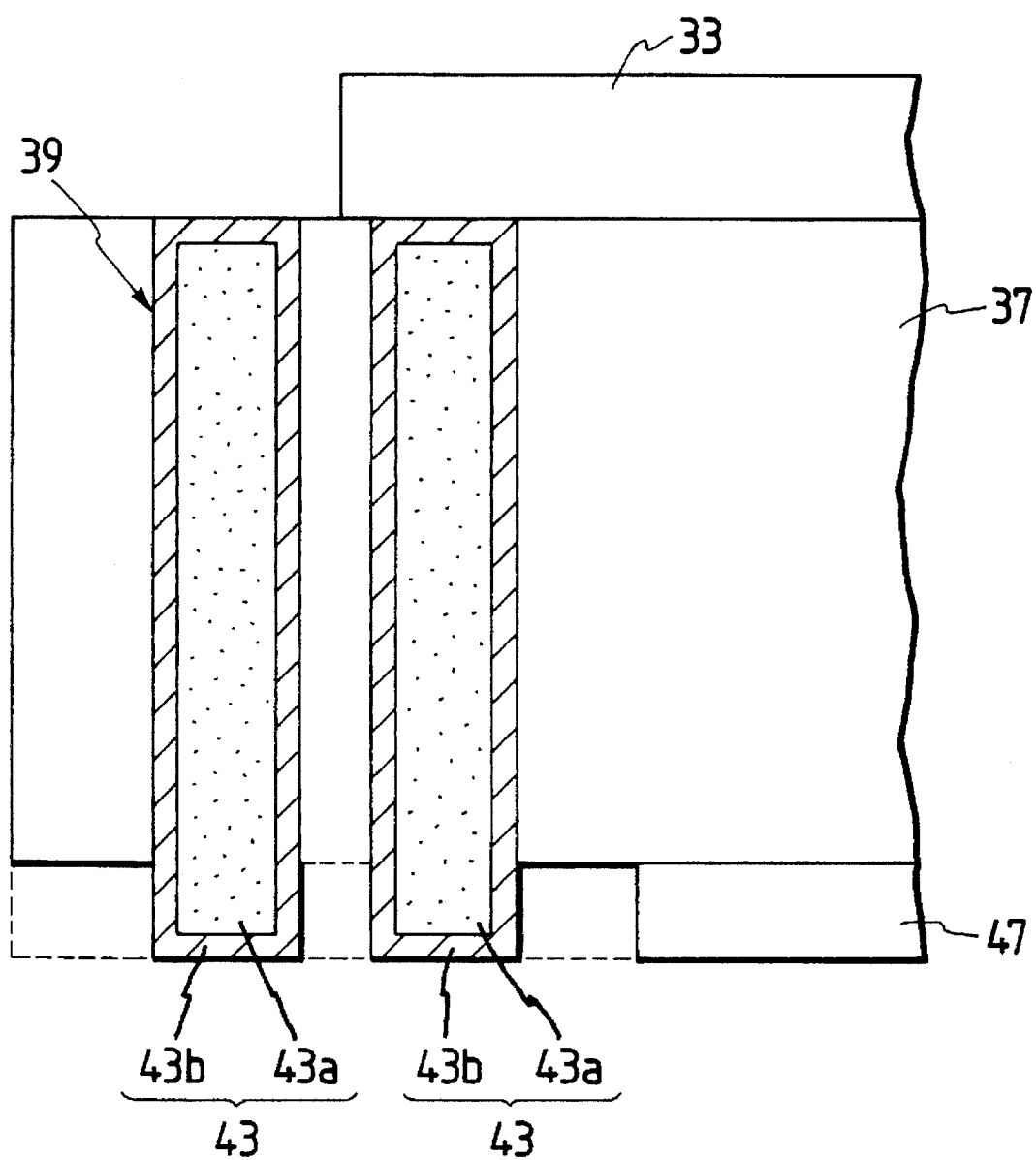
FIG. 7 is an enlarged side cross sectional view of a through hole penetrating the module substrate shown in FIG. 4.

FIG. 7 is an enlarged side cross sectional view of the through hole penetrating the module substrate 37 shown in FIG. 4.

For example, as shown in FIG. 7, the deformable bushing 43 comprises a cylinder-shaped basic form portion 43a made of resin with plasticity and a conductive film 43b coated over the entire surface of the basic form portion 43a with conductive material. The resin making the basic form portion 43a is selected from the group consisting of fluorocarbon resin, polyimide, and liquid crystal polymer. Also, the conductive material making the conductive film 43b is selected from the group consisting of copper, gold and silver.

The conductive film 43b is formed on the basic form portion 43a by a gilding method, a deposition method or a spattering method. In cases where the conductive film 43b cannot be attached to the surface of the basic form portion 43a because of the shortage of adhesive power, a mediate film made of chromium or nickel is formed on the basic form portion 43a before the conductive film 43b is formed on the mediate film. Also, in cases where wettability of the conductive film 43b to conductive solder is inferior, a conductive solder layer is formed over the entire conductive film 43b.

Figure 8:
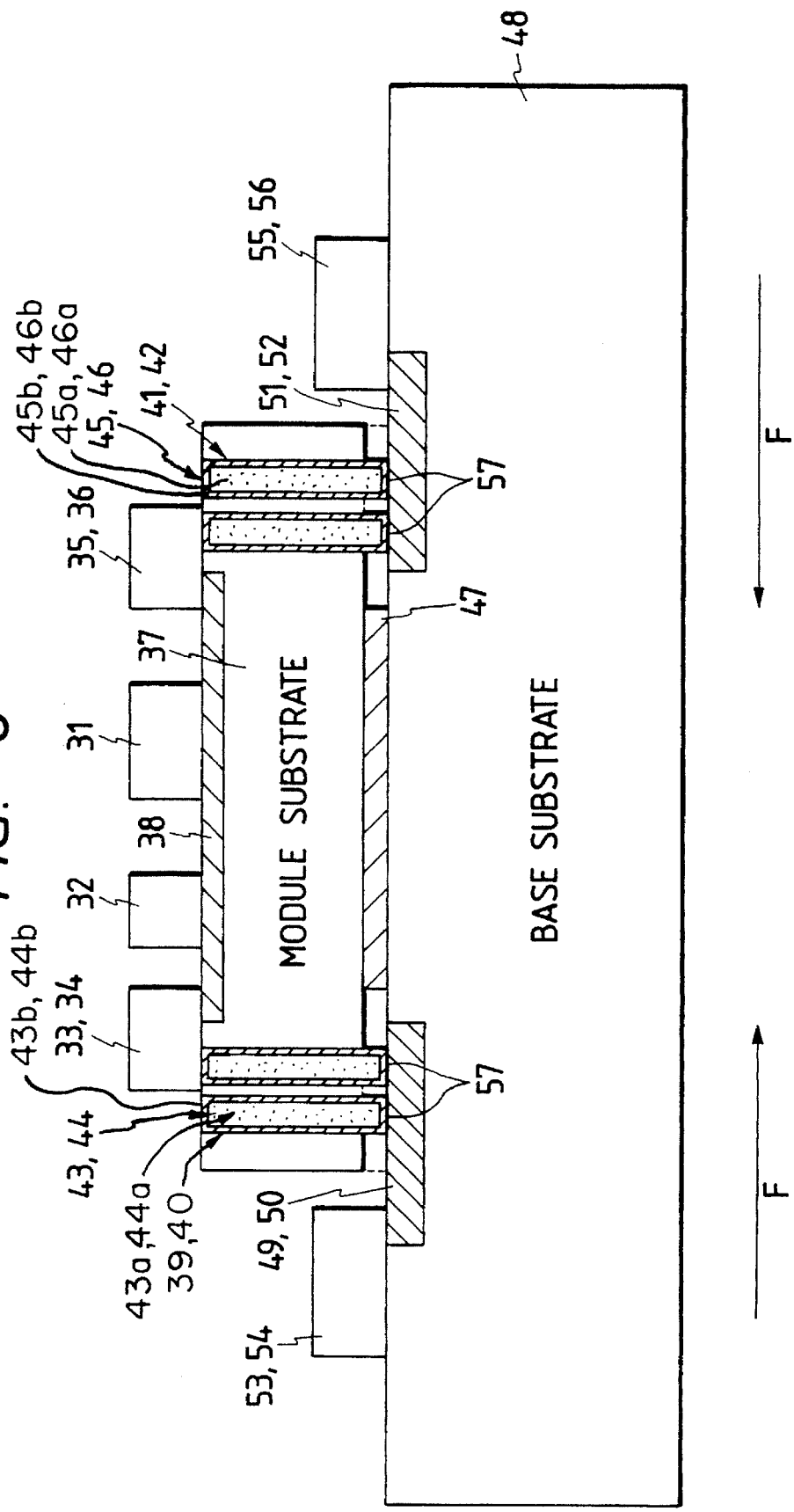
FIG. 8 is a side cross sectional view showing conditions that the module substrate 37 shown in FIG. 4 is attached to a base substrate.

The other deformable bushings 44 to 46 comprise basic form portions 44a to 46a and conductive films 44b to 46b, as shown in FIG. 8, in the same manner as the deformable bush 43.

In the above configuration of the module substrate 37 with the deformable bushing 43, the deformable bush 43 is fitted in the through hole 39 so as to electrically connect the jumper wire 33 with the conductive film 43b. Therefore, the electronic parts 31 to 36 mounted on the module substrate 37 are electrically connected with the reverse surface of the module substrate 37.

FIG. 8 is a side cross sectional view showing conditions that the module substrate 37 shown in FIG. 4 is attached to a base substrate.

As shown in FIG. 8, the module substrate 37 is mounted on a base substrate 48 made of glass epoxy material. The base substrate 48 is provided with printed wires 49 to 52 and electronic parts 53 to 56 such as a chip type of condenser. The electronic parts 53 to 56 are electrically connected with the respective printed wires 49 to 52. In addition, the deformable bushings 43 to 46 are connected with the respective printed wires 49 to 52 through conductive connecting material such as conductive solder 57. In other words, the conductive films 43b to 46b of the deformable bushings 43 to 46 are soldered with the printed wires 49 to 52. Therefore, the electronic parts 31 to 36 are electrically connected with the printed wires 49 to 52 through the deformable bushings 43 to 46.

In the above configuration of the module substrate 37 attached to the base substrate 48, a procedure for attaching the module substrate 37 to the base substrate 48 is described.

The printed wires 49 to 52 are initially printed on the base substrate 48, and the electronic parts 53 to 56 are attached to the base substrate 48 through conductive solder layers. Thereafter, conductive solder layers 57 are coated on the printed wires 49 to 52 planned to be mounted by the deformable bushings 43 to 46 before the module substrate 37 is mounted on the base substrate 48 so as to contact the deformable bushings 43 to 46 with the printed wires 49 to 52.

Thereafter, the module substrate 37 mounted on the base substrate 48 is passed through a heater such as a reflow device to melt the conductive solder layers 57 before the module substrate 37 mounted on the base substrate 48 is gradually cooled in the atmosphere to solidify the conductive solder layers 57.

At the cooling time, little contraction is generated in the module substrate 37 because the module substrate 37 is made of the dielectric ceramic material, while the base substrate 48 considerably contracts because the base substrate 48 is made of the glass epoxy material. Therefore, tensile stress F is generated to urge the module substrate 37 to contract according to the considerable contraction of the base substrate 48. The direction of the tensile stress F given to the module substrate 37 is indicated in FIG. 8 by arrows. That is, the direction of the tensile stress F equals the direction of the contraction of the base substrate 48.

Conventionally, the tensile stress F functions to break the bond of the conductive films 43b to 46b to the printed wires 49 to 52. Therefore, a conventional module substrate is peeled from a base substrate.

Figure 9:
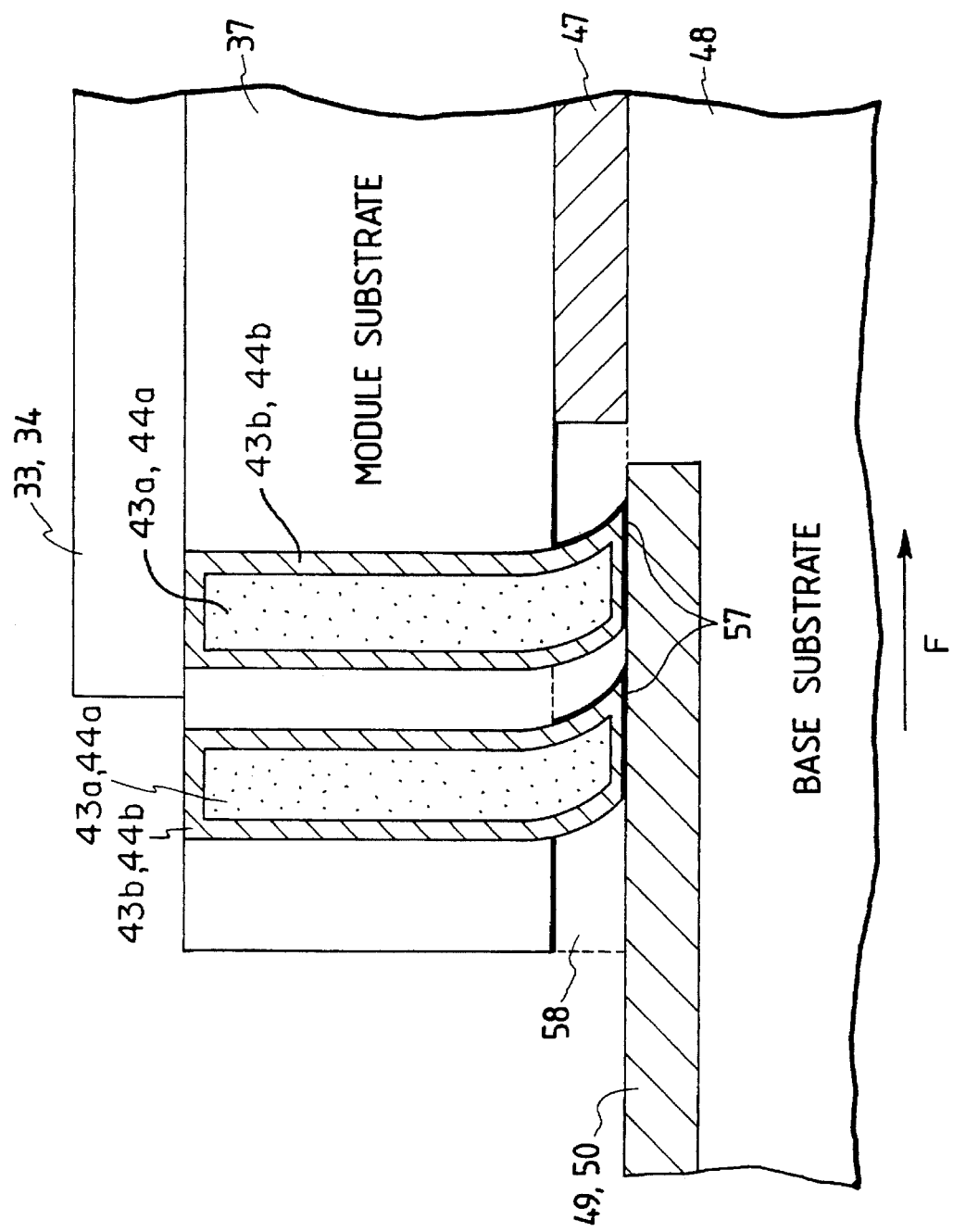
FIG. 9 is an enlarged side cross sectional view showing conditions that bushings are deformed according to the contraction of the base substrate shown in FIG. 8.

However, in the present invention, as shown in FIGS. 8, 9 because openings 58 surrounded by the module substrate 37, the earth terminal 47 and the base substrate 48 are formed, the conductive film 43b to 46b of the deformable bushings 43 to 46 are elastically deformed in the direction of the tensile stress F so as to absorb the tensile stress F and the basic form portion 43a to 46a are plastically deformed to hold the conductive film 43b to 46b. Therefore, the attachment of the conductive films 43b to 46b of the deformable bushings 43 to 46 to the printed wires 53 to 56 of the base substrate 48 is not broken. As a result, the module substrate 37 with the deformable bushings 43 to 46 is reliably attached to the base substrate 48 even though the tensile stress is generated.

Accordingly, even though the degree of thermal expansion of the module substrate 37 differs from that of the base substrate 48 because the deformable bushings 43 to 46 are elastically or plastically deformed so as to absorb the tensile stress resulting from the difference in the contraction of both the base substrate 48 and the module substrate 37, the electronic parts 31 to 36 on the module substrate 37 can be electrically connected with the electronic parts 53 to 56 on the base substrate 48 through the conductive films 43b to 46b.

Moreover, because the cylinder-shaped deformable bushings 43 to 46 are utilized, the deformable bushings can be easily fitted in the through holes 39 to 42 without considering the direction of the deformable bushings. Also, the tensile stress can be uniformly absorbed by the cylinder-shaped deformable bushings. Moreover, the deformable bushings can be easily transformed to fit in the through holes.

In addition, because the conductive films 43b to 46b are integrally formed with the deformable bushings 43 to 46, the basic form portion 43a to 46b can be easily deformed according to the deformation of the conductive films 43b to 46b. Also, the module substrate 37 can be easily constructed.

Moreover, because the conductive films 43b to 46b are coated over the entire surfaces of the basic form portion 43a to 46a of the deformable bushings 43 to 46, the cross-sectional area of the conductive films 43b to 46b can be large.

2. Second Embodiment

Figure 10:
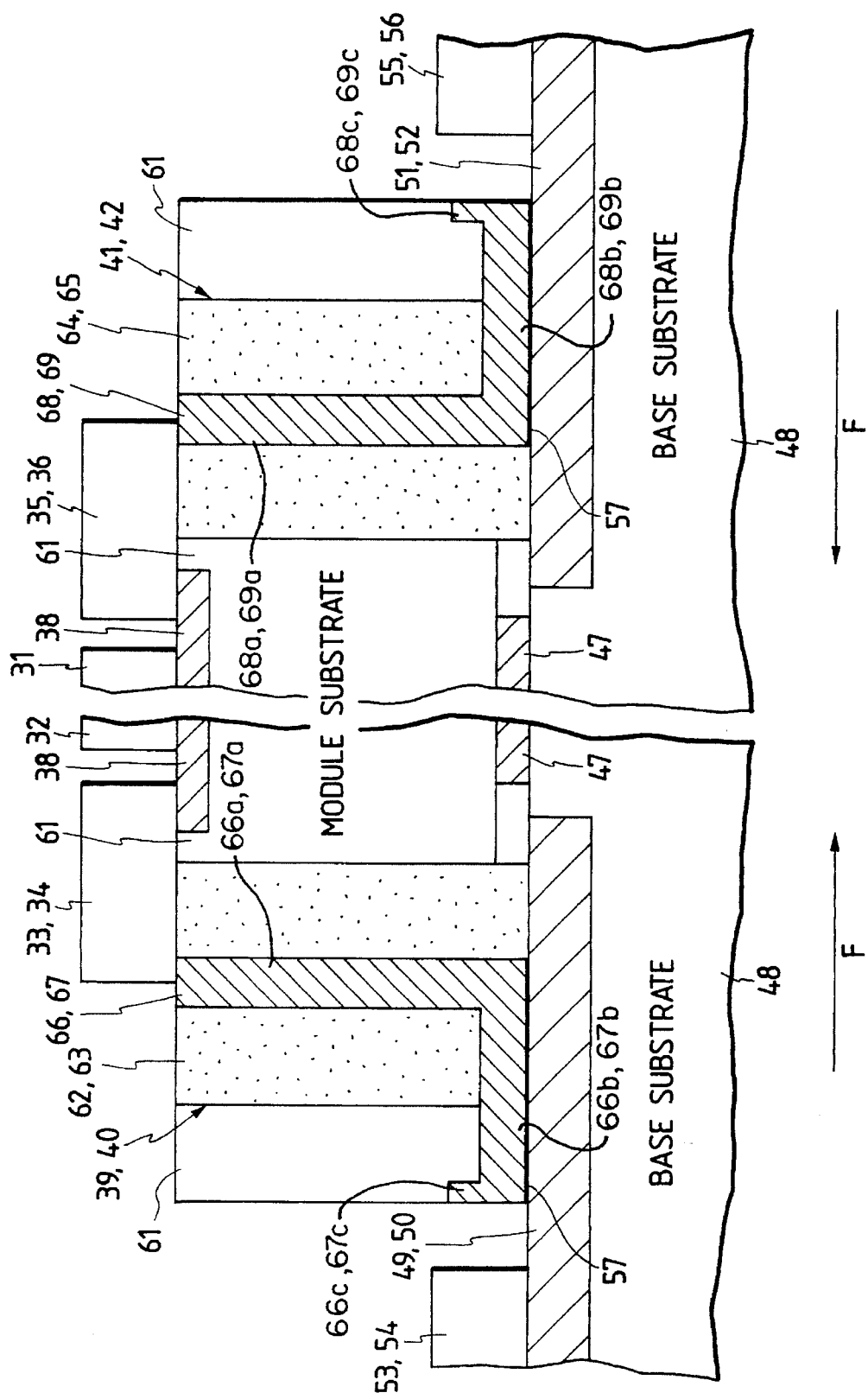
FIG. 10 is an enlarged side cross sectional view of a module substrate attached to a base substrate according to a second embodiment of the present invention.

FIG. 10 is an enlarged side cross sectional view of a module substrate attached to a base substrate according to a second embodiment of the present invention.

As shown in FIG. 10, the electronic parts 31 to 36 and the printed wires 38 are mounted on a surface of a module substrate 61 made of dielectric ceramic material in the same manner as in the first embodiment. In addition, the module substrate 61 is equipped with the column-shaped through holes 39, 40, 41, and 42 in the same manner as in the first embodiment.

Figure 11:
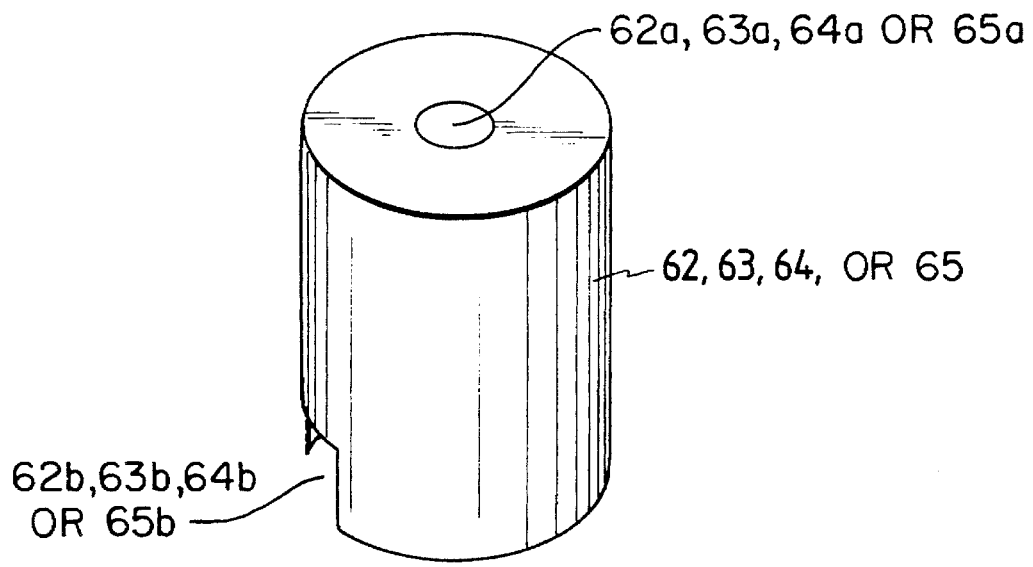
FIG. 11 is a diagonal view of a bushing fitted in a through hole of the module substrate shown in FIG. 10.

Moreover, cylinder-shaped deformable bushings 62, 63, 64, and 65 shown in FIG. 11 are fitted in the through holes 39 to 42 while applying pressure. The deformable bushings are made of resin with plasticity selected from the group consisting of fluorocarbon resin, polyimide, and liquid crystal polymer.

As shown in FIG. 11, for example, the deformable bushing 62 has a penetrating hole 62a extending in an axis direction thereof and a base groove 62b extending in a radius direction thereof. The base groove 62b is connected with the penetrating hole 62a at the base center of the deformable bushing 62. In the same manner, the deformable bushings 63 to 65 have penetrating holes 63a to 65a and base grooves 63b to 65b in the same manner as the deformable bushing 62.

Figure 12:
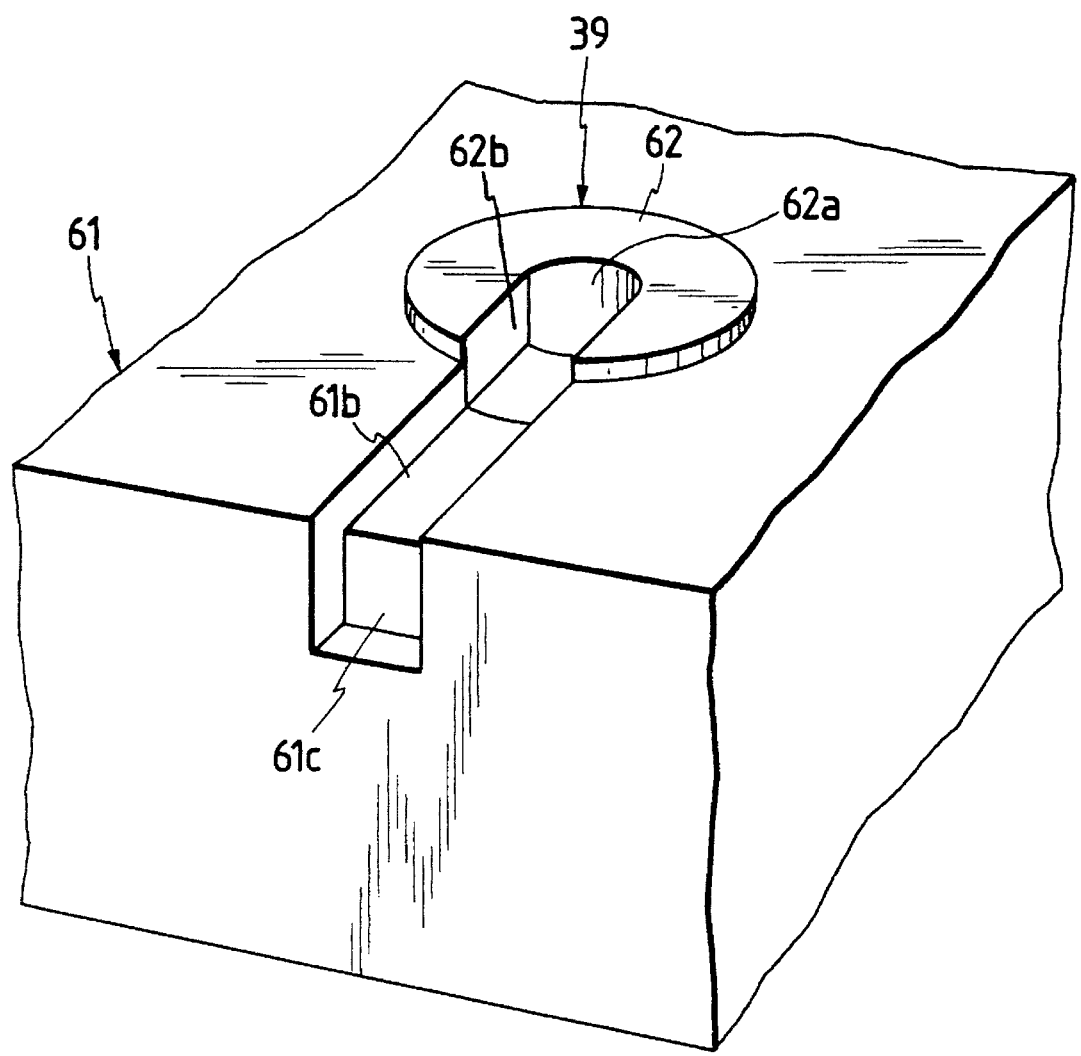
FIG. 12 is a diagonal view of the reverse surface of the module substrate shown in FIG. 10.

FIG. 12 is a diagonal view of the reverse surface of time module substrate 61 with the deformable bushings.

As shown in FIG. 12, for example, a lateral groove 61b extending from the base groove 62b of the deformable bushing 62 to an end of the module substrate 61 and a deep groove 61c deeply formed in the end of the module substrate 61 are provided on the reverse surface of the module substrate 61 surrounding the through hole 39. In the same manner, the other base grooves and the other deep grooves are provided on the reverse surface of the module substrate 61 surrounding the through holes 40 to 42.

According to the second embodiment, conductive terminals are fitted in the deformable bushings 62 to 65 and the lateral grooves formed on the reverse surface of the module substrate 61 while applying pressure to electrically connect the electronic parts 31 to 36 on the module substrate 61 with the electronic parts 53 to 56 on the base substrate 48. The conductive terminals are made of conductive material such as copper and the like.

Figure 13:
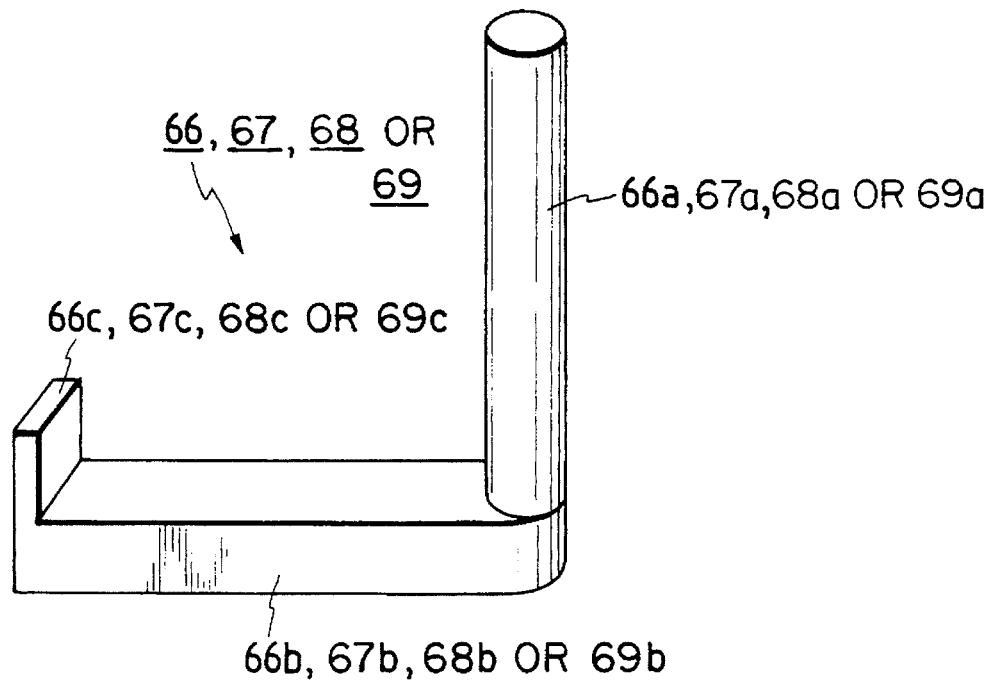
FIG. 13 is a diagonal view of a conductive terminal fitted in a penetrating hole of the bushing shown in FIG. 11.

FIG. 13 is a diagonal view of one of the conductive terminals fitted in the deformable bushings while applying pressure.

As shown in FIG. 13, a conductive terminal 66 consists of a lateral portion 66b fitted in both the base groove 62b of the deformable bushing 62 and the lateral groove 61b of the module substrate 61, a longitudinal portion 66a positioned at an end of the lateral portion 66b and fitted in the penetrating hole 62a, and a projecting portion 66c positioned at the other end of the lateral portion 66b and fitted in the deep groove 61c of the module substrate 61. In the same manner, conductive terminals 67, 68, and 69 are constructed to fit in the deformable bushings 63 to 65 and the module substrate 61.

Figure 14:
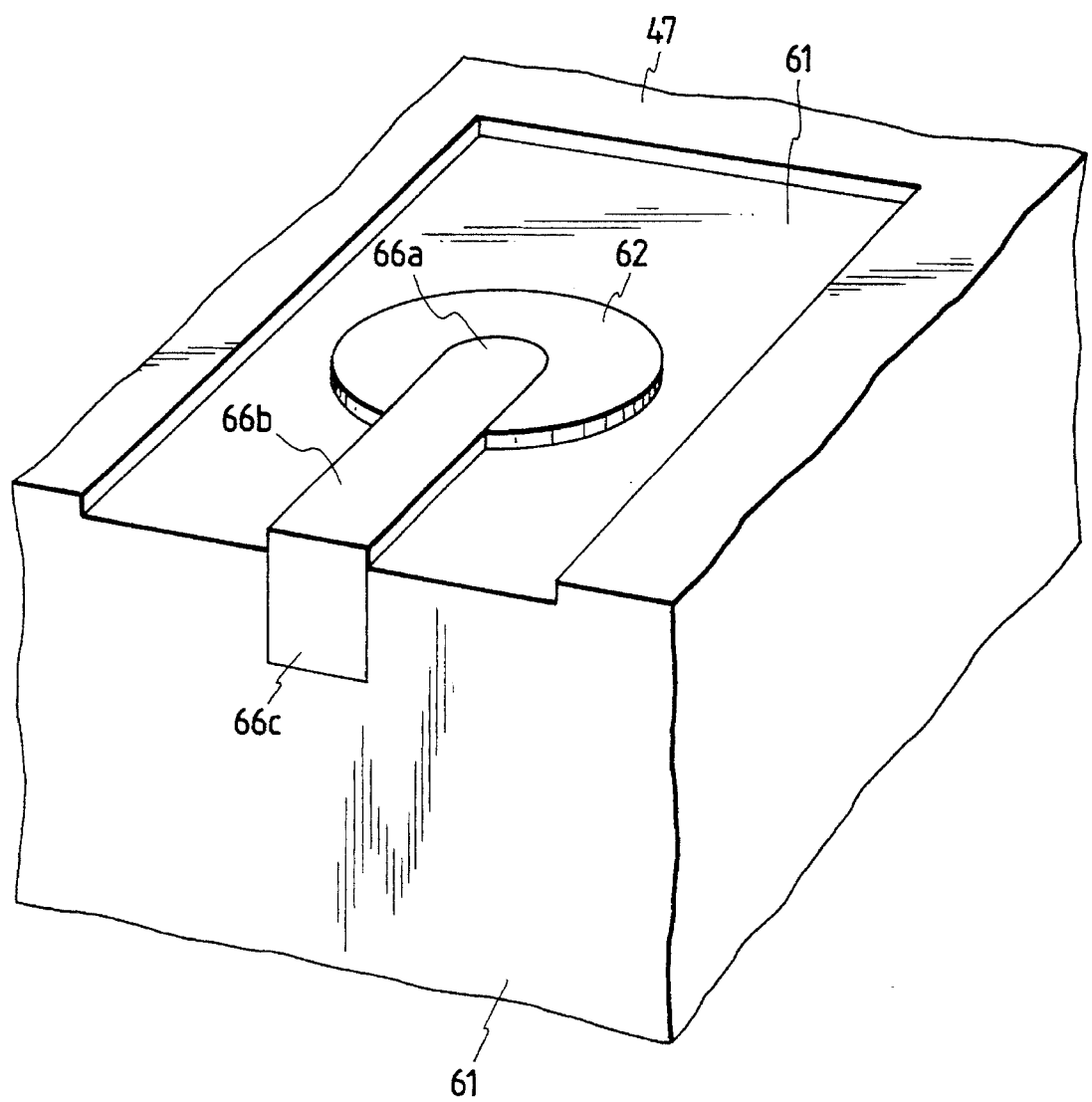
FIG. 14 is a diagonal view of the conductive terminal fitted in the bushing and the module substrate shown in FIG. 10.

In cases where the conductive terminal 66 is inserted into the deformable bushing 62 and the module substrate 61 after the deformable bushing 62 is initially fitted in the through hole 39 while applying pressure, the longitudinal portion 66a of the conductive terminal 66 is pressed into the penetrating hole 62a of the deformable bushing 62 from the reverse surface of the module substrate 61. Thereafter, the lateral portion 66b of the conductive terminal 66 is fitted in both the base groove 62b of the deformable bushing 62 and the lateral groove 61b of the module substrate 61. At the same time, the projecting portion 66c of the conductive terminal 66 is fitted in the deep groove 61c of the module substrate 61. Therefore, as shown in FIG. 14, the conductive terminal 66 is completely fitted in the deformable bushing 62 and the module substrate 61.

In the above configuration of the module substrate 61 with the deformable bushing and the conductive terminal, a procedure for attaching the module substrate 61 to the base substrate 48 is described.

The base substrate 48 is initially prepared in the same manner as in the first embodiment. Thereafter, conductive solder layers 57 are coated on the printed wires 49 to 52 planned to be mounted by the conductive terminals 66 to 69 before the module substrate 61 is mounted on the base substrate 48 so as to contact the conductive terminals 66 to 69 with the printed wires 49 to 52.

Thereafter, the module substrate 61 mounted on the base substrate 48 is passed through a heater such as a reflow device to melt the conductive solder layers 57 before the module substrate 61 mounted on the base substrate 48 is gradually cooled in the atmosphere to solidify the conductive solder layers 57.

At the cooling time, little contraction is generated in the module substrate 61 because the module substrate 61 is made of the dielectric ceramic material, while the base substrate 48 considerably contracts because the base substrate 48 is made of the glass epoxy material. Therefore, tensile stress F is generated to urge the module substrate 61 to contract according to the considerable contraction of the base substrate 48. The direction of the tensile stress F given to the module substrate 61 is indicated in FIG. 10 by arrows.

Figure 15:
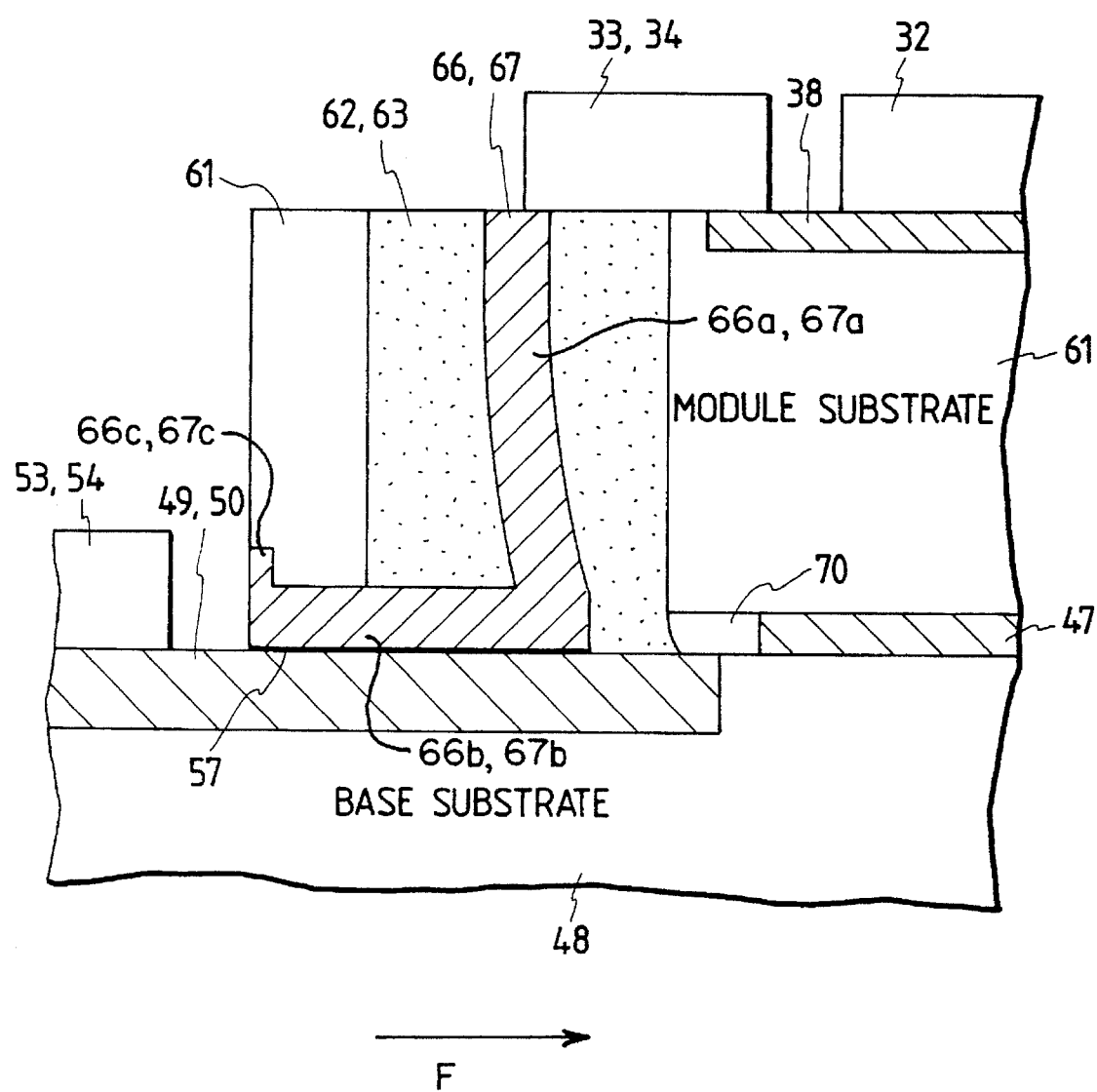
FIG. 15 is an enlarged side cross sectional view showing conditions that bushing and conductive terminals are deformed according to the contraction of the base substrate shown in FIG. 10.

However, as shown in FIGS. 10, 15 because openings 70 surrounded by the module substrate 61, the earth terminal 47 and the base substrate 48 are formed, the longitudinal portions 66a to 69a of the conductive terminals 66 to 69 are elastically deformed to absorb the tensile stress in the present invention. In addition, the deformable bushings 62 to 65 are plastically deformed so as to hold the longitudinal portions 66a to 69a. Therefore, the attachment of the conductive terminals 66 to 69 to the printed wires 53 to 56 of the base substrate 48 is not broken. As a result, the module substrate 61 is reliably attached to the base substrate 48.

Wherein because the thermal expansion of the conductive terminal is considerably large as compared with those of the module substrate 61 and the base substrate 48, the conductive terminals 66 to 69 can be elastically deformed regardless of the attachment of the projecting portions 66c to 69c to the module substrate 61.

Accordingly, even though the degree of thermal expansion of the module substrate 61 differs from that of the base substrate 48 because the conductive terminals 66 to 69 and the deformable bushings 62 to 65 are deformed so as to absorb the tensile stress resulting from the difference in the contraction of both the base substrate 48 and the module substrate 61, the electronic parts 31 to 36 on the module substrate 61 can be electrically connected with the electronic parts 53 to 56 on the base substrate 48 through the conductive terminals 66 to 69.

In addition, because the cross-sectional area of the conductive terminals 66 to 69 is large as compared with the conductive films 43b to 46b in the first embodiment, the resistance of the conductive terminals 66 to 69 are comparatively low. Therefore, signals can be transmitted between the electronic parts without any deterioration.

Moreover, because the mechanical strength of the conductive terminals 66 to 69 is superior to that of the conductive films 43b to 46b, even though any shock is given to the module substrate 61 from the outside, the attachment of the conductive terminals 66 to 69 to the printed wires 49 to 52 on the base substrate 48 is hardly broken.

3. Third Embodiment

Figure 16:
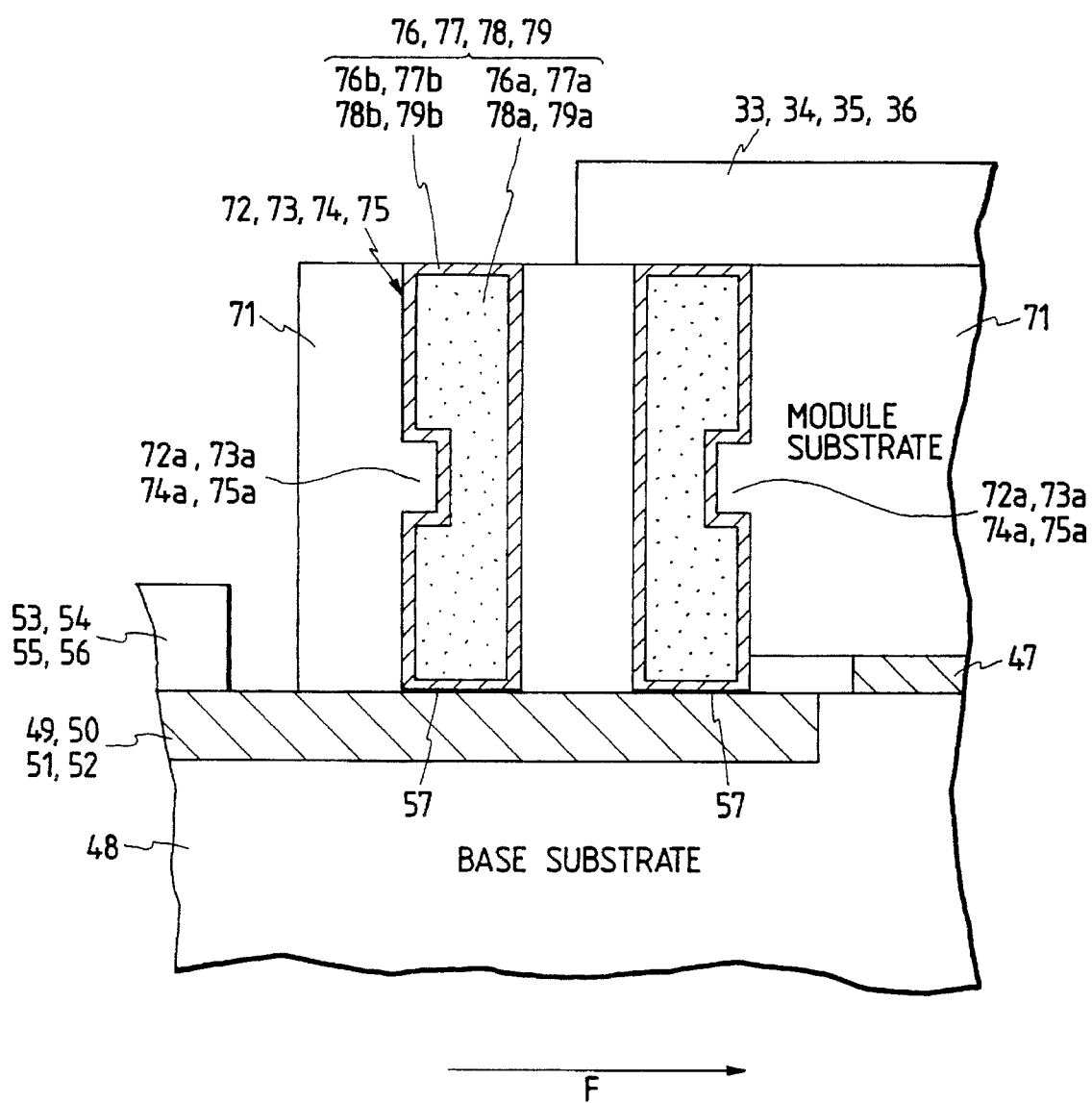
FIG. 16 is an enlarged side cross sectional view of a module substrate attached to a base substrate according to a third embodiment of the present invention.

FIG. 16 is an enlarged side cross sectional view of a module substrate attached to a base substrate according to a third embodiment of the present invention.

As shown in FIG. 16, the electronic parts 31 to 36 and the printed wires 38 are mounted on a surface of a module substrate 71 made of dielectric ceramic material in the same manner as in the first embodiment. In addition, the module substrate 71 is equipped with column-shaped through holes 72, 73, 74 and 75 in which ring-shaped convex portions 72a to 75a are projected. The ring-shaped convex portions are provided on the central side of the column-shaped through holes.

Moreover, cylinder-shaped deformable bushings 76, 77, 78 and 79 are fitted in the through holes 72 to 75 while applying pressure.

For example, the deformable bushing 76 comprises a basic form portion 76a made of resin with plasticity and a conductive film 76b coated over the entire surface of the basic form portion 76a with conductive material.

The resin making the basic form portion 76a is selected from the group consisting of fluorocarbon resin, polyimide, and liquid crystal polymer. Also, the conductive material making the conductive film 76b is selected from the group consisting of copper, gold and silver.

The conductive film 76b is formed on the basic form portion 76a by a gilding method, a deposition method or a spattering method. In cases where the conductive film 76b cannot be attached to the surface of the basic form portion 76a because of the shortage of adhesive power, a mediate film made of chromium or nickel is formed on the basic form portion 76a before the conductive film 76b is formed on the mediate film. Also, in cases where wettability of the conductive film 76b to conductive solder is inferior, a conductive solder layer is formed over the entire conductive film 76b.

The other deformable bushings 77 to 79 comprise basic form portions 77a to 79a and conductive films 77b to 79b in the same manner as the deformable bushing 76.

Figure 17:
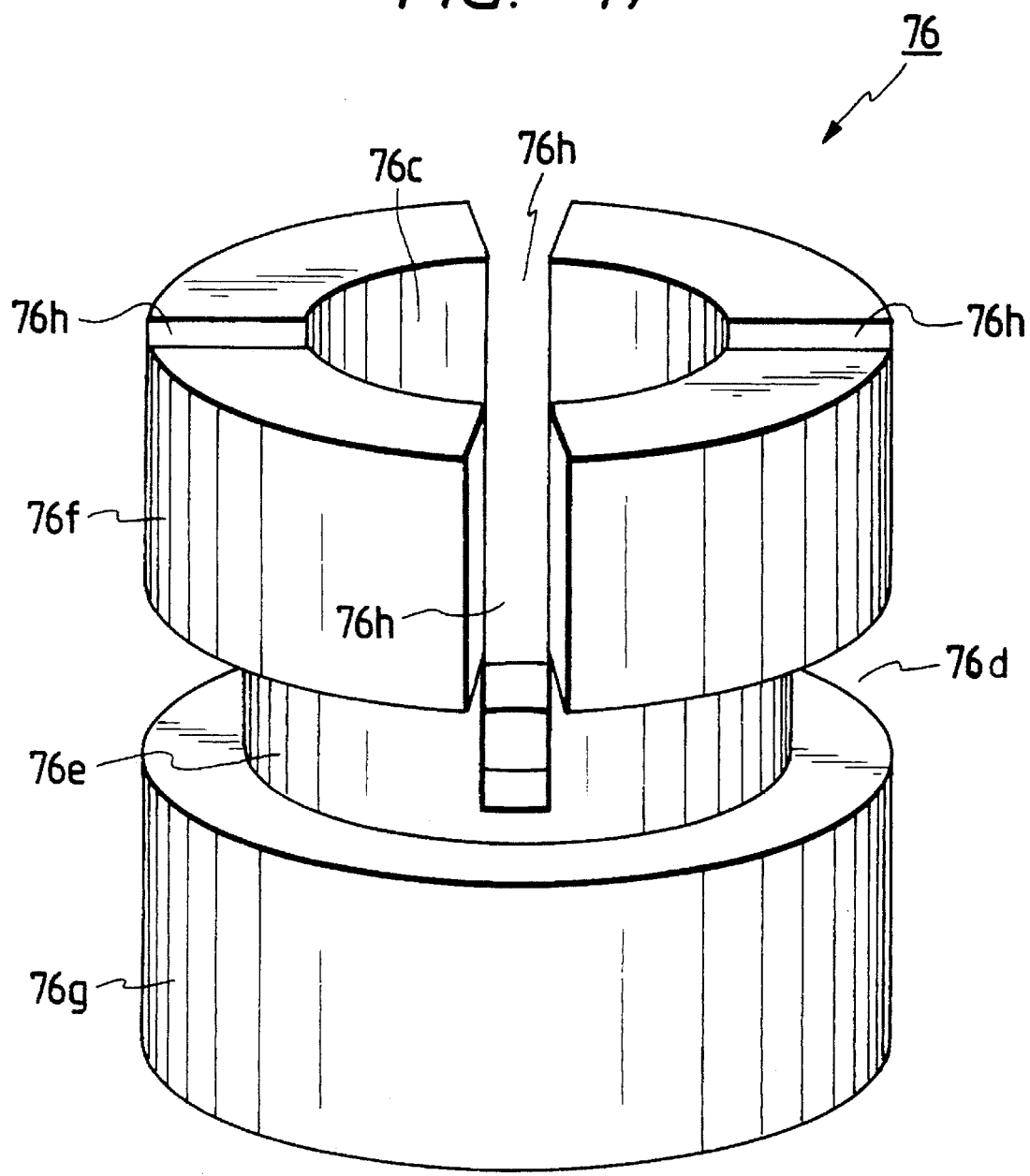
FIG. 17 is a diagonal view of a cylinder-shaped bushing inserted into a through hole of the module substrate shown in FIG. 16.

FIG. 17 is a diagonal view of the cylinder-shaped deformable bushing 76.

As shown in FIG. 17, the cylinder-shaped deformable bushing 76 is formed so as to surround a penetrating hole 76c extending in an axis direction. Moreover, a ring-shaped concavity 76d is provided so as to make a trunk portion 76e in the central side of the basic form portion 76a. Therefore, when the deformable bushing 76 is pressed into the through hole 72, the ring-shaped convex portion 72a of the through hole 72 fits in the ring-shaped concavity 76d. In addition, an upper brim portion 76f is formed above the trunk portion 76e, and a lower brim portion 76g is formed under the trunk portion 76e. The upper brim portion 76f is divided into four pieces by four longitudinal openings 76h. The longitudinal openings 76h is extended to the trunk portion 76e. Therefore, when the deformable bushing 76 is pressed into the through hole 72, the upper brim portion 76f is easily transformed to pass through a narrow path surrounded by the ring-shaped convex portion 72a.

The other deformable bushings 77 to 79 are formed in the same manner as the deformable bushing 76.

Next, a procedure for inserting the deformable bushing 76 into the through hole 72 is described.

Figure 18A:
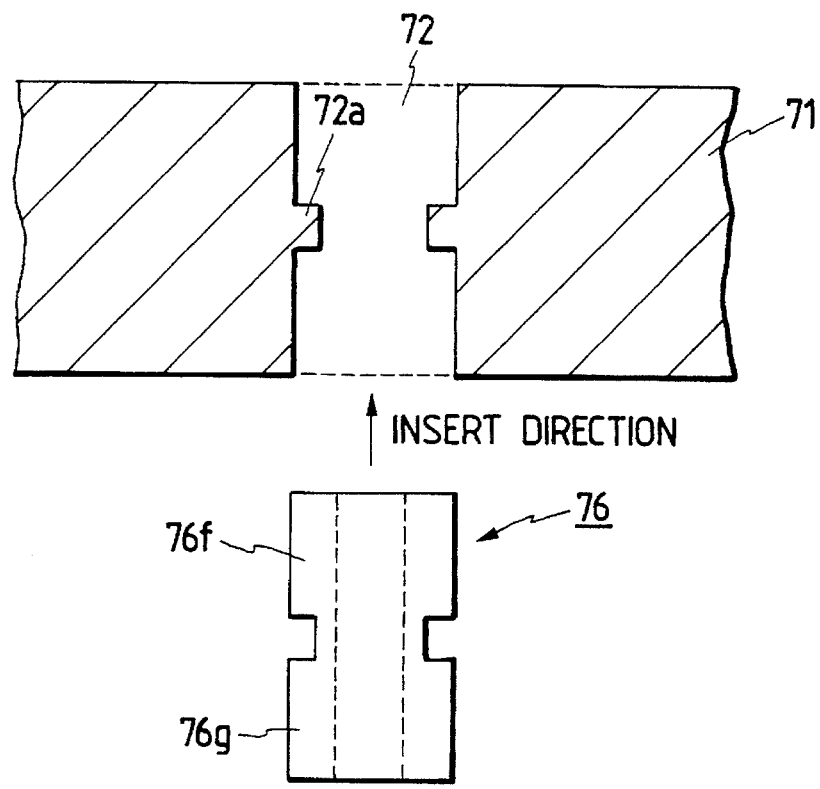
FIG. 18A is a cross sectional view explanatorily showing both a through hole and a bushing not inserted into the through hole of the module substrate shown in FIG. 16.

FIG. 18A is a cross sectional view explanatorily showing both the through hole 72 and the deformable bushing 76 not inserted into the through hole 72.

Figure 18B:
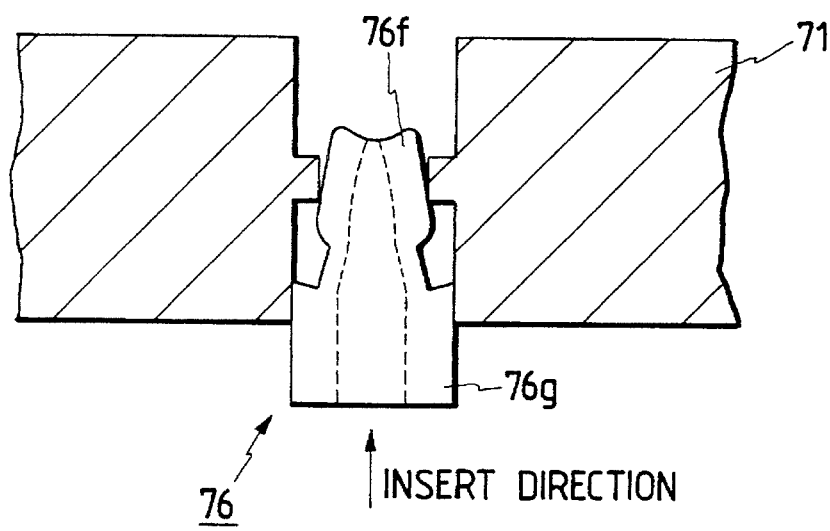
FIG. 18B is a cross sectional view explanatorily showing both a through hole and a bushing of which an upper brim portion is Just passing through a narrow opening surrounded by a ring-shaped convex portion of a through hole of the module substrate shown in FIG. 16.

FIG. 18B is a cross sectional view explanatorily showing both the through hole 72 and the deformable bushing 76 of which the upper brim portion 76f is just passing through the narrow openings surrounded by the ring-shaped convex portion 72a of the through hole 72.

As shown in FIG. 18A, the deformable bushing 76 of which the upper brim portion 76f faces the reverse surface of the module substrate 71 is inserted into the through hole 72 from the reverse surface of the module substrate 71.

When the upper brim portion 76f of the deformable bushing 76 reaches the ring-shaped convex portion 72a, as shown in FIG. 18B, the upper brim portion 76f is transformed to pass through the narrow opening surrounded by the ring-shaped convex portion 72a of the through hole 72. In this case, the longitudinal opening 76h enables the upper brim portion 76f to be transformed. When the upper brim portion 76f is passed through the ring-shaped convex portion 72a, the upper brim portion 76f is returned to the original form shown in FIG. 17. At the same time, the ring-shaped convex portion 72a of the through hole 72 fits in the ring-shaped concavity 76d. As a result, the deformable bushing 76 is firmly held in the through hole 72.

Therefore, the deformable bushing 76 is fitted in the through hole 72 so as to electrically connect the jumper wire 33 with the conductive film 76b.

The other deformable bushings 77 to 79 are inserted into the through holes 73 to 75 in the same manner as the deformable bushing 76.

Accordingly, even though the deformable bushing is roughly sized to the through hole, there is no case that the deformable bushing is taken off from the through hole because the ring-shaped convex portion of the through hole fits in the ring-shaped concavity of the deformable bushing.

Next, a procedure for attaching the module substrate 71 with the deformable bushings 76 to 79 to the base substrate 48 is described.

The base substrate 48 is initially prepared in the same manner as in the first embodiment. Thereafter, conductive solder layers 57 are coated on the printed wires 49 to 52 planned to be mounted by the deformable bushings 76 to 79 before the module substrate 71 is mounted on the base substrate 48 so as to contact the deformable bushings 76 to 79 with the printed wires 49 to 52.

Thereafter, the module substrate 71 mounted on the base substrate 48 is passed through a heater such as a reflow device to melt the conductive solder layers 57 before the module substrate 71 mounted on the base substrate 48 is gradually cooled in the atmosphere to solidify the conductive solder layers 57.

At the cooling time, little contraction is generated in the module substrate 71, while the base substrate 48 considerably contracts. Therefore, tensile stress F is generated to urge the module substrate 71 to contract according to the considerable contraction of the base substrate 48. The direction of the tensile stress F given to the module substrate 71 1s indicated in FIG. 16 by arrows.

However, in the present invention, because the conductive films 76b to 79b of the deformable bushings 76 to 79 are deformed In the direction of the tensile stress so as to absorb the tensile stress F, and the basic form portion 76a to 79a of the deformable bushings 76 to 79 are plastically deformed to hold the conductive films 76b to 79b, the attachment of the conductive films 76b to 79b of the deformable bushings 76 to 79 to the printed wires 53 to 56 of the base substrate 48 is not broken. As a result, the module substrate 71 is reliably attached to the base substrate 48.

Accordingly, even though the degree of thermal expansion of the module substrate 71 differs from that of the base substrate 48, because the deformable bushings 76 to 79 are deformed so as to absorb the tensile stress resulting from the difference in the contraction of both the base substrate 48 and the module substrate 71, the electronic parts 31 to 36 on the module substrate 71 can be electrically connected with the electronic parts 53 to 56 on the base substrate 48 through the conductive films 76b to 79b.

4. Fourth Embodiment

FIG. 19 is an enlarged side cross sectional view of a module substrate attached to a base substrate according to a fourth embodiment of the present invention.

As shown in FIG. 19, the electronic parts 31 to 36 and the printed wires 38 are mounted on a surface of a module substrate 81 made of dielectric ceramic material in the same manner as in the first embodiment. In addition, the module substrate 81 is equipped with column-shaped through holes 82, 83, 84 and 85 in which ring-shaped convex portions 82a to 85a are projected in the same manner as in the third embodiment.

In addition, cylinder-shaped deformable bushings 86, 87, 88 and 89 made of resin material with plasticity are fitted in the through holes 82 to 85 while applying pressure. The resin material of the deformable bushings 86 to 89 are selected from the group consisting of fluorocarbon resin, polyimide, and liquid crystal polymer.

The deformable bushing 86 consists essentially of a ring-shaped concavity 86d, a trunk portion 86e, an upper brim portion 86f, and a lower brim portion 86g in the same manner as the deformable bushing 76 in the third embodiment. In addition, a base groove 86h is digged in the base of the deformable bushing 86 in the same manner as the base groove 62b of the deformable bushing 62 according to the second embodiment.

The other deformable bushings 87 to 89 are formed in the same manner as the deformable bushing 86.

In addition, conductive terminals 90 to 93 are fitted in the deformable bushings 86 to 89 and lateral grooves 81b formed on the reverse surface of the module substrate 81 while applying pressure to electrically connect the electronic parts 31 to 36 on the module substrate 81 with the electronic parts 53 to 56 on the base substrate 48. The conductive terminals 90 to 93 are made of conductive material such as copper.

For example, the conductive terminal 90 consists of a lateral portion 90b fitted in both the base groove 86h of the deformable bushing 86 and a lateral groove 81b of the module substrate 81, a longitudinal portion 90a positioned at an end of the lateral portion 90b and fitted in a penetrating hole of the deformable bushing 86, and a projecting portion 90c positioned at the other end of the lateral portion 90b and fitted in a deep groove 81c of the module substrate 81 in the same manner as that in the second embodiment.

In the same manner, the conductive terminals 91 to 93 are constructed to fit in the deformable bushings 83 to 85 and the module substrate 81.

In the above configuration of the module substrate 81 with the deformable bushings and the conductive terminals, the electronic parts 31 to 36 on the module substrate 81 are electrically connected with the reverse surface of the module substrate 81 through the conductive terminals 90 to 93.

Next, a procedure for attaching the module substrate 81 to the base substrate 48 is described.

The base substrate 48 is initially prepared in the same manner as in the first embodiment. Thereafter, conductive solder layers 57 are coated on the printed wires 49 to 52 planned to be mounted by the conductive terminals 90 to 93 before the module substrate 81 is mounted on the base substrate 48 so as to contact the conductive terminals 90 to 93 with the printed wires 49 to 52.

Thereafter, the module substrate 81 mounted on the base substrate 48 is passed through a heater such as a reflow device to melt the conductive solder layers 57 before the module substrate 81 mounted on the base substrate 48 is gradually cooled in the atmosphere to solidify the conductive solder layers 57.

At the cooling time, because the degree of thermal expansion of the module substrate 81 differs from that of the base substrate 48, tensile stress F is generated to urge the module substrate 81 to contract according to the considerable contraction of the base substrate 48. The direction of the tensile stress F given to the module substrate 81 is indicated in FIG. 19 by arrows.

However, the longitudinal portions 90a to 93a of the conductive terminals 90 to 93 are elastically deformed to absorb the tensile stress F in the present invention, and the deformable bushings 86 to 89 are plastically deformed so as to hold the longitudinal portions 90a to 93a. Therefore, the attachment of the conductive terminals 90 to 93 to the printed wires 53 to 56 of the base substrate 48 is not broken. As a result, the module substrate 81 is reliably attached to the base substrate 48.

Accordingly, even though the degree of thermal expansion of the module substrate 81 differs from that of the base substrate 48, because the conductive terminals 90 to 93 and the deformable bushings 86 to 89 are deformed so as to absorb the tensile stress resulting from the difference in the contraction of both the base substrate 48 and the module substrate 81, the electronic parts 31 to 36 on the module substrate 81 can be electrically connected with the electronic parts 53 to 56 on the base substrate 48 through the conductive terminals 90 to 93.

In addition, because the cross-sectional area of the conductive terminals 90 to 93 is large as compared with the conductive films 43b to 46b in the first embodiment, the resistance of the conductive terminals 90 to 93 are comparatively low and the mechanical strength of the conductive terminals 90 to 93 is superior to that of the conductive films 43b to 46b.

In addition, even though the deformable bushing is roughly sized to the through hole, there is no case that the deformable bushing is taken off from the through hole because the ring-shaped convex portion of the through hole fits in the ring-shaped concavity of the deformable bushing.

In the first and fourth embodiments, little contraction is generated in the module substrate 37, 61, 71 and 81 while the base substrate 48 considerably contracts. However, even though little contraction is generated in a base substrate and a module substrate considerably contracts, the deformable bushings and the conductive terminals function as well as those in the first and fourth embodiments.

5. Result of Experiments

Prior to submission of this application, inventors of this application implements experiments to examine the possibility that the conductive terminal 90 inserted in the deformable bushing 86 according to the fourth embodiment is detached from the printed wire 49 on the base substrate 48 when the module substrate 81 mounted on the base substrate 48 is cooled.

That is, a reflow procedure is implemented as follows. The module substrate 81 mounted on the base substrate 48 through conductive solder 57 is passed through a reflow device to heat the substrates 48, 81 more than or equal to 200° C. for fifty to sixty seconds. Therefore, the solder 57 is melted. After the substrates 48, 81 are taken out from the reflow device, the substrates 48, 81 are gradually cooled for about thirty minutes so that the melted solder 57 is solidified to attach the module substrate 81 to the base substrate 48. At the same time, tensile stress is generated in the solidified solder 57 to urge the module substrate 81 to be detached from the base substrate 48. Thereafter, the substrates 48, 81 are finally cooled at room temperature. Therefore, the reflow procedure is accomplished. The above reflow procedure is repeated four times by the inventors. In addition, the inventors examine whether or not the module substrate 81 is detached from the base substrate 48 each time the reflow procedure is implemented.

The inventors utilize four types of samples to measure the possibility of the detachment of the module substrate 81 from the base substrate 48 according to the fourth embodiment. In addition, twenty samples are manufactured for each type of sample.

The result of the experiments is shown in FIG. 20.

FIG. 20 shows results of experiments indicating the improvement of detachment of the module substrate from the base substrate shown in FIG. 19 in tabular form.

As shown in FIG. 20, the base substrate 48 is made of the glass epoxy resin. The module substrate 81 is made of $Al_2O_3$ in sample No. 1, $Ba_2Ti_9O_{20}$ in sample No. 2, aluminium enamel in sample No. 3, and quartz polyimide in sample No. 4. The deformable bushing 86 is made of fluorocarbon resin in sample No. 1 and sample No. 2, polyimide in sample No. 3, and liquid crystal polymer in sample No. 4.

Figure 1:
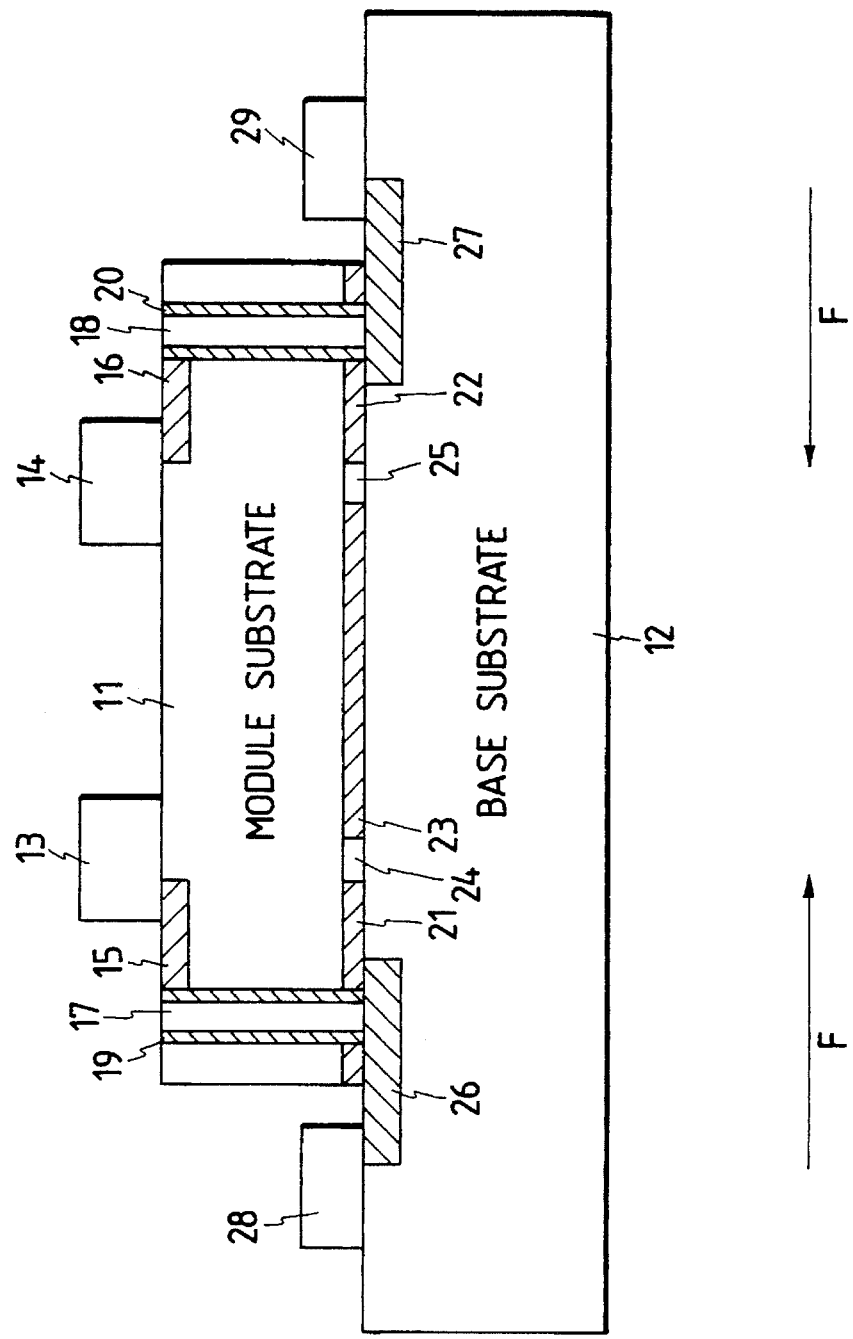
FIG. 1 is a side cross sectional view of a conventional module substrate attached to a base substrate.
Figure 2:
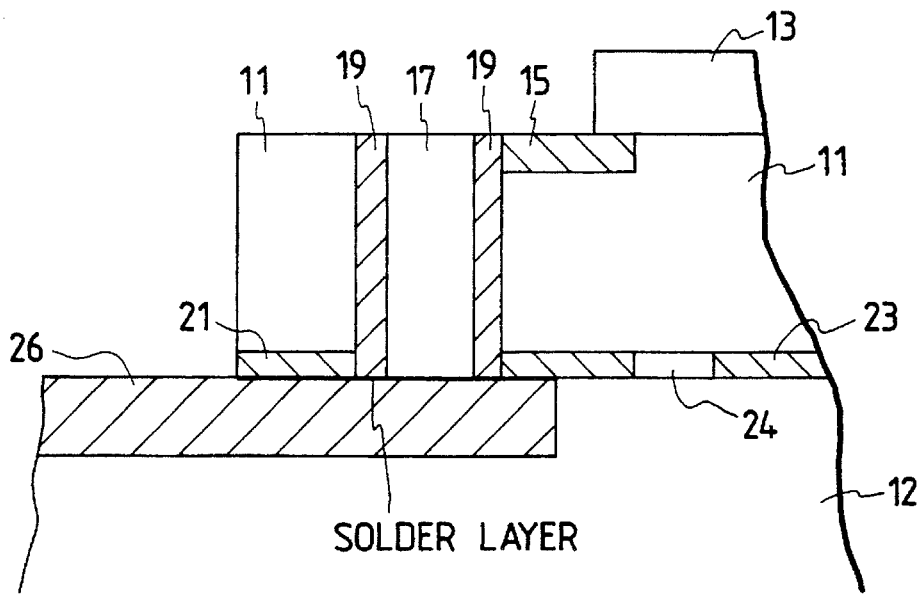
FIG. 2 is an enlarged side cross sectional view of conducting parts of the conventional module substrate shown in FIG. 1.
Figure 3:
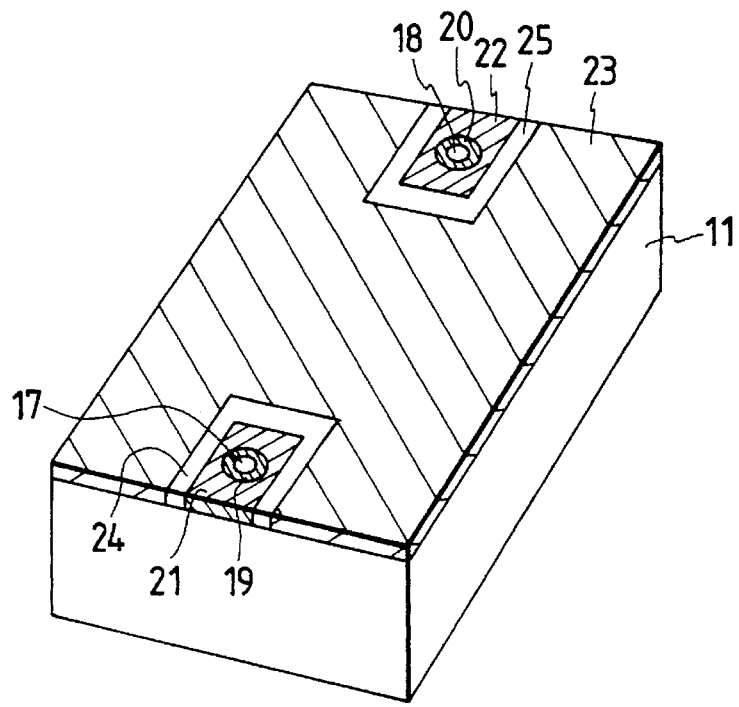
FIG. 3 is a diagonal view showing a lower surface of the conventional module substrate shown in FIG. 1.

In addition, experiments utilizing the module substrate 11 according to the conventional configuration shown in FIG. 1 are implemented to compare characteristics of the module substrate 81 with those of the conventional module substrate 11. The inventors utilize four types of samples to measure the possibility of the detachment of the module substrate 11 from the base substrate 12 according to the conventional configuration. That is, the base substrate 12 is made of the glass epoxy resin. The module substrate 11 is made of $Al_2O_3$ in sample No. 5, $Ba_2Ti_9O_{20}$ in sample No. 6, aluminium enamel in sample No. 7, and quartz polyimide in sample No. 8. In addition, twenty samples are manufactured for each type of sample.

The result of the experiments is as follows.

In cases where the experiments are implemented by utilizing the module substrate 11 according to the conventional configuration, the detachment of the module substrate 11 from the base substrate 12 is generated at a comparatively high possibility in case of the sample No. 5, 6 and 8 even though the reflow procedure is implemented only once for each sample. Also, the detachment is necessarily generated in case of the sample No. 5, 6 and 8 when the reflow procedure is implemented more than 2 repetitions. In addition, the detachment is generated at a high possibility in cases of the sample No. 7 when the reflow procedure is implemented more than 2 repetitions.

On the other hand, in cases where the experiments are implemented by utilizing the module substrate 81 according to the fourth embodiment of the present invention, the detachment of the module substrate 81 from the base substrate 48 is not generated in case of the sample No. 1, 2 and 4 even though the reflow procedure is implemented 3 repetitions for each sample, and the detachment is generated at a low possibility in case of the sample No. 1, 2 and 4 even though the reflow procedure is implemented with 4 repetitions for each sample. In addition, the detachment is not generated in case of the sample No. 3 even though the reflow procedure is implemented with 4 repetitions.

Accordingly, the possibility of the detachment can be considerably reduced by utilizing the module substrate 48 according to the fourth embodiment. The reason is because the conductive terminals 90 to 93 are deformed to absorb the tensile stress resulting from the difference in the contraction of the substrates 48, 81 and the deformable bushings 86 to 89 are plastically deformed to hold the conductive terminals 90 to 93.

The same result of the experiments is obtained when the module substrates 37, 61 and 71 are utilized to measure the possibility of the detachment according to the first, second and third embodiments of the present invention.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A face-mounting type module substrate, comprising:

a module substrate mounting first electronic parts on a front surface thereof;

a through hole penetrating the module substrate from the front surface to its reverse surface;

a conductive film placed in the through hole for electrically conducting the first electronic parts of the module substrate to the reverse surface of the module substrate;

attaching means made of a thin film having conductivity for attaching the conductive film to a base substrate movably contacting the reverse surface of the module substrate to electrically connect the first electronic parts of the module substrate with second electronic parts of the base substrate, the module substrate being directly mounted on the base substrate face to face; and a bushing held in the through hole for holding the conductive film to maintain the attachment of the conductive film to the base substrate regardless of whether the base substrate is moved, the bushing being made of resin with plasticity, and the conductive film being coated on a surface of the bushing.

2. A face-mounting type module substrate according to claim 1 in which the bushing is cylinder-shaped.

3. A face-mounting type module substrate according to claim 1 in which the conductive film coated on the surface of the bushing is made of a conductive material selected from the group of copper, gold and silver.

4. A face-mounting type module substrate according to claim 1 in which the module substrate is made of dielectric ceramic material selected from the group consisting of $Al_2O_3$, $Ba_2Ti_9O_{20}$, aluminum enamel, and quartz polyimide.

5. A face-mounting type module substrate according to claim 1 in which the resin of the bushing is selected from the group consisting of fluorocarbon resin, polyimide, and liquid crystal polymer.

6. A face-mounting type module substrate according to claim 1 in which the attaching means is a conductive solder.

7. A face-mounting type module substrate according to claim 1 in which the conductive film is composed of a mediate film coated on the surface of the bushing and a conductive film coated on the mediate film, a material of the mediate film being selected from the group of chromium and nickel, and a material of the conductive film being selected from the group of copper, gold and silver.

8. A face-mounting type module substrate according to claim 1 wherein the bushing has a property of plastic deformation so that a stress occurring through the attaching means between the module substrate and the base substrate resulting from the cooling down of the module substrate and the base substrate subsequent to both substrates having been heated to attach to each other is absorbed and released by the bushing.

9. A face-mounting type module substrate, comprising:

a module substrate having mounted on a front surface thereof first electronic parts;

a through hole penetrating the module substrate from the front surface to its reverse surface;

a conductive film placed in the through hole for electrically conducting the first electronic parts of the module substrate to the reverse surface of the module substrate;

attaching means made of a thin film having conductivity for attaching the conductive film to a base substrate movably contacting with the reverse surface of the module substrate to electrically connect the first electronic parts of the module substrate with second electronic parts of the base substrate, the module substrate being directly mounted on the base substrate face to face, and the module substrate being attached to the base substrate through the attaching means by hardening the heated thin film; and a bushing held in the through hole for holding the conductive film, the bushing being made of resin with plasticity so as to be plastically deformable for absorbing a stress occurring between the module substrate and the base substrate.

10. A face-mounting type module substrate according to claim 9 in which the stress occurring between the module substrate and the base substrate is caused by the module substrate and the base substrate being cooled down subsequent to both substrates having been heated to attach to each other through the attaching means.

* * * * *

UNITED STATES PATENT AND TRADEMARK OFFICE
CERTIFICATE OF CORRECTION

PATENT NO. : 5,495,395
DATED : February 27, 1996
INVENTOR(S): Takehiko Yoneda et al.

It is certified that error appears in the above-identified patent and that said Letters Patent is hereby corrected as shown below:

Title page:
Foreign Application Priority Data has been omitted. It should read as follows:

[30] Foreign Application Priority Data

Sept. 30, 1991       [JP]       Japan . . . . . . . 3-251321

Signed and Sealed this

Second Day of July, 1996

Attest:

BRUCE LEHMAN

*Attesting Officer*    *Commissioner of Patents and Trademarks*